(12) United States Patent
Nomura

(10) Patent No.: US 10,580,732 B2
(45) Date of Patent: Mar. 3, 2020

(54) SEMICONDUCTOR DEVICE

(71) Applicant: LAPIS SEMICONDUCTOR CO., LTD., Kanagawa (JP)

(72) Inventor: Akihiko Nomura, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 16/028,370

(22) Filed: Jul. 5, 2018

(65) Prior Publication Data
US 2018/0315705 A1 Nov. 1, 2018

Related U.S. Application Data

(63) Continuation of application No. 15/492,074, filed on Apr. 20, 2017, now Pat. No. 10,043,743, which is a
(Continued)

(30) Foreign Application Priority Data

Oct. 30, 2013 (JP) .................................. 2013-225826

(51) Int. Cl.
*H01L 29/40* (2006.01)
*H01L 23/522* (2006.01)
(Continued)

(52) U.S. Cl.
CPC .... *H01L 23/5226* (2013.01); *H01L 21/02118* (2013.01); *H01L 21/02318* (2013.01);
(Continued)

(58) Field of Classification Search
CPC ......... H01L 21/76898; H01L 21/76877; H01L 21/02118
See application file for complete search history.

(56) References Cited

U.S. PATENT DOCUMENTS

2006/0180933 A1 8/2006 Kanamori et al.
2007/0241457 A1 10/2007 Ida
(Continued)

FOREIGN PATENT DOCUMENTS

JP S58-112344 A 7/1983
JP 2005-019521 A 1/2005
(Continued)

*Primary Examiner* — Samuel A Gebremariam
(74) *Attorney, Agent, or Firm* — Kubotera & Associates, LLC

(57) ABSTRACT

A semiconductor device includes a semiconductor substrate having a first main surface and a second main surface opposite to the first main surface; a first conductive layer disposed on the second main surface; a second conductive layer passing through the semiconductor substrate from the first main surface to the second main surface so that the second conductive layer is connected to the first conductive layer; an organic insulation film disposed to contact with the first conductive layer; and a first insulation layer disposed to contact with the organic insulation film. The second conductive layer has a first portion passing through the semiconductor substrate so that the first portion contacts with the semiconductor substrate through the organic insulation film and the first insulation layer.

7 Claims, 28 Drawing Sheets

Related U.S. Application Data continuation of application No. 14/518,137, filed on Oct. 20, 2014, now Pat. No. 9,659,841.

(51) Int. Cl.

| | | |
|---|---|---|
| H01L 23/48 | (2006.01) | |
| H01L 21/768 | (2006.01) | |
| H01L 21/02 | (2006.01) | |
| H01L 23/528 | (2006.01) | |
| H01L 23/532 | (2006.01) | |

(52) U.S. Cl.
CPC ...... *H01L 21/76898* (2013.01); *H01L 23/481* (2013.01); *H01L 23/5283* (2013.01); *H01L 23/53238* (2013.01); *H01L 21/76831* (2013.01); *H01L 21/76832* (2013.01); *H01L 2924/0002* (2013.01)

(56) References Cited

U.S. PATENT DOCUMENTS

| | | | |
|---|---|---|---|
| 2011/0193241 A1* | 8/2011 | Yen | H01L 21/76898 257/774 |
| 2011/0200937 A1 | 8/2011 | Orihara et al. | |
| 2012/0115323 A1 | 5/2012 | Muragishi et al. | |
| 2013/0313688 A1 | 11/2013 | Nomura | |

FOREIGN PATENT DOCUMENTS

| | | |
|---|---|---|
| JP | 2005-150354 A | 6/2005 |
| JP | 2006-237594 A | 9/2006 |
| JP | 2007-053149 A | 3/2007 |
| JP | 2007-305960 A | 11/2007 |
| WO | 2010-047264 A | 4/2010 |
| WO | 2011-111308 A | 9/2011 |

* cited by examiner

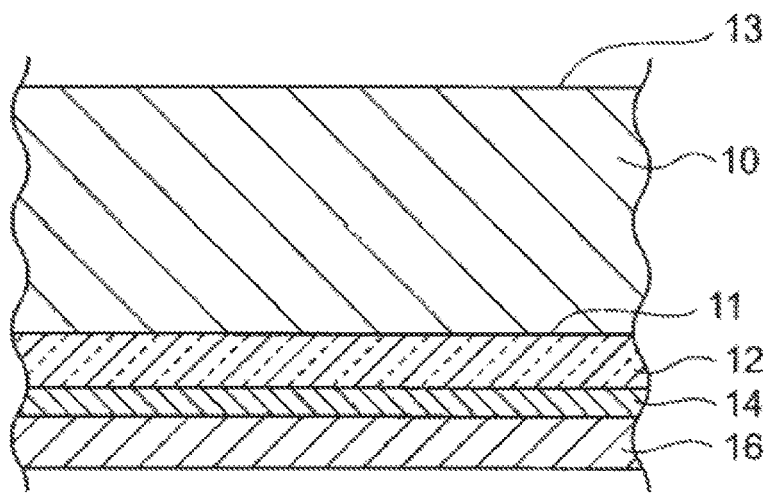
FIG.17 (A) Related Art
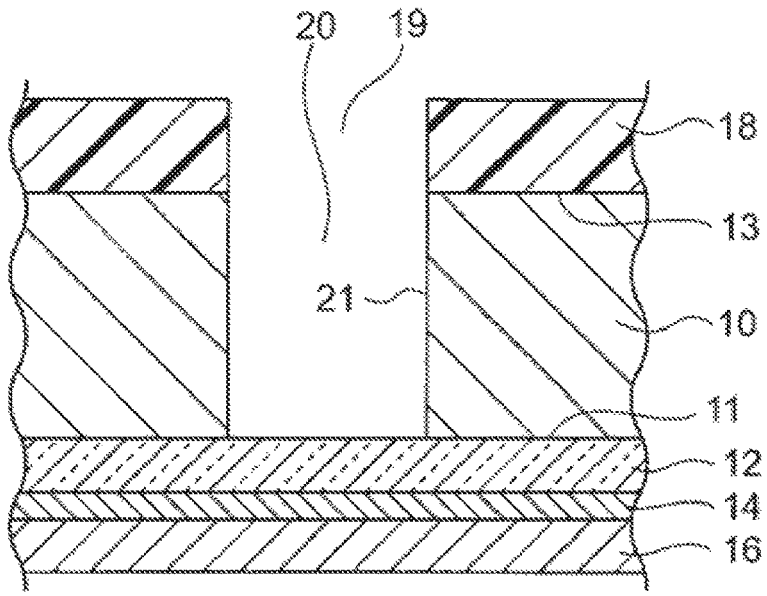
FIG.17 (B) Related Art
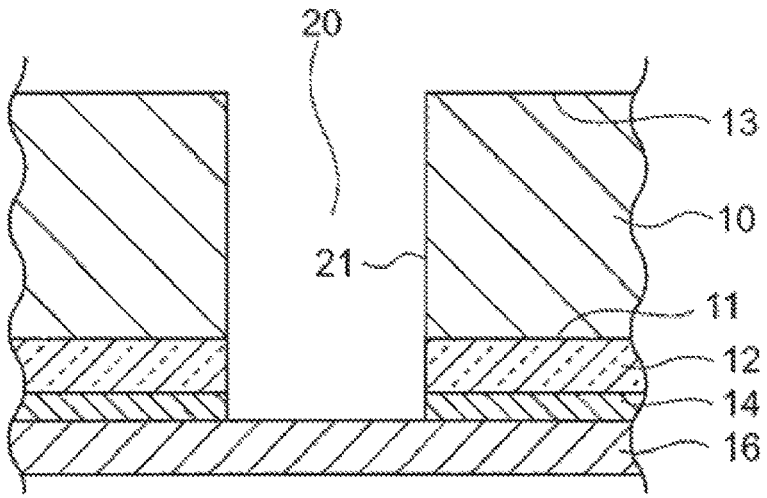
FIG.17 (C) Related Art

SEMICONDUCTOR DEVICE

CROSS-REFERENCE TO RELATED APPLICATIONS

This is a continuation application of a prior application Ser. No. 15/492,074, filed on Apr. 20, 2017, allowed, which is a divisional application of a prior application Ser. No. 14/518,137, issued on May 23, 2017 as U.S. Pat. No. 9,659,841.

BACKGROUND OF THE INVENTION AND RELATED ART STATEMENT

The present invention relates to a semiconductor device and a method of producing the semiconductor device. In particular, the present invention relates to a semiconductor device having a silicon through electrode (TSV, Through Silicon Via), and to a method of producing the semiconductor device.

Various types of conventional semiconductor devices and methods thereof have been developed in the past. Some of the conventional semiconductor devices have a configuration, in which an electrode (TSV, Through Silicon Via) is disposed through a through hole passing through a semiconductor substrate such as a silicon substrate and the like (refer to Patent References 1 and 2).

Patent Reference 1: Japanese Patent Publication No. 2005-19521

Patent Reference 2: Japanese Patent Publication No. 2006-237594

In the conventional semiconductor device having the TSV, an insulation film may be disposed in the through hole formed in the silicon substrate. When the insulation film is deteriorated, the reliability of the conventional semiconductor device tends to be lowered.

In view of the problems of the conventional semiconductor device described above, an object of the present invention is to provide a semiconductor device and a method of producing the semiconductor device including a through electrode formed in a substrate and capable of achieving high reliability.

Further objects and advantages of the invention will be apparent from the following description of the invention.

SUMMARY OF THE INVENTION

In order to attain the objects described above, according to a first aspect of the present invention, a method of producing a semiconductor device includes a step of forming a through hole in a semiconductor substrate. The semiconductor substrate has a first main surface, a second main surface opposite to the first main surface, and a conductive layer disposed on the second main surface, so that the through hole passes through the semiconductor substrate from the first main surface to the second main surface.

According to the first aspect of the present invention, the method of producing the semiconductor device further includes a step of forming an insulation film to extend from a bottom portion of the through hole on a side of the second main surface to the first main surface through a side surface of the through hole.

According to the first aspect of the present invention, the method of producing the semiconductor device further includes steps of coating an organic member on at least the insulation film on the side surface of the through hole and the insulation film on the first main surface; removing an air bubble in the organic member and an air bubble between the organic member and the insulation film; and forming an opening portion in the organic member.

According to a second aspect of the present invention, a semiconductor device includes a semiconductor substrate having a first main surface; a second main surface opposite to the first main surface; a first conductive layer disposed on the second main surface; and a through hole passing through the semiconductor substrate from the first main surface to the second main surface.

According to the second aspect of the present invention, the semiconductor device further includes an insulation film extending from a bottom portion of the through hole on a side of the second main surface to the first main surface through a side surface of the through hole; an organic insulation film formed on the insulation film; and a second conductive layer formed to extend from the bottom portion of the through hole to the first main surface through the side surface of the through hole. The second conductive layer has a layer thickness on the second main surface greater than that in the through hole.

According to the present invention, the semiconductor device includes the through electrode formed in the semiconductor substrate. According to the present invention, it is possible to provide the semiconductor device and the method of producing the semiconductor device capable of achieving high reliability.

BRIEF DESCRIPTION OF THE DRAWINGS

FIGS. 17(A) to 17(C) are schematic vertical sectional views No. 1 showing a method of producing a semiconductor device according to a comparative example;

DETAILED DESCRIPTION OF PREFERRED EMBODIMENTS

Hereunder, preferred embodiments of the present invention will be explained with reference to the accompanying drawings.

First Embodiment

Figure 5:
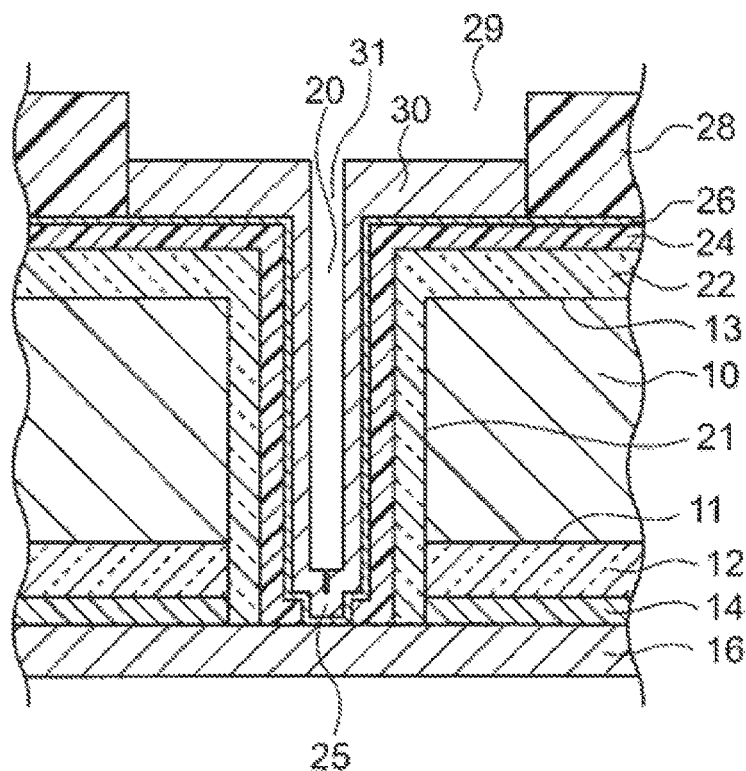
FIGS. 5(A) and 5(B) are schematic vertical sectional views No. 5 showing the method of producing the semiconductor device according to the first embodiment of the present invention.
Figure 5:
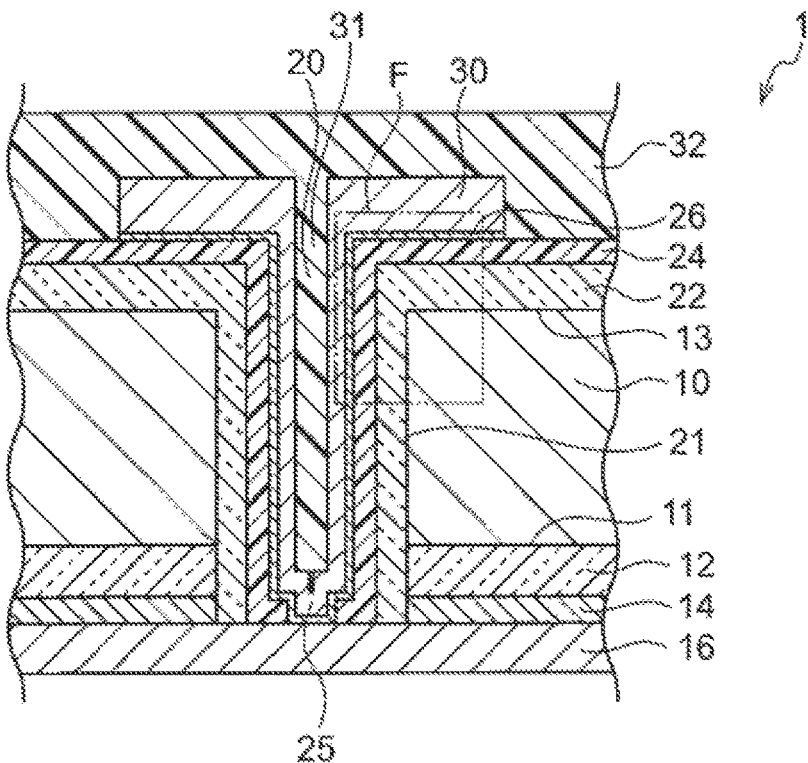

A first embodiment of the present invention will be explained. As shown in FIG. 5(B), a semiconductor device 1 includes a semiconductor silicon substrate 10; a silicon oxide film 12; a titanium nitride (TiN) film 14; an aluminum (Al) film 16; a through hole 20; a CVD (Chemical Vapor Deposition) oxide film 22; an organic insulation film 24; a shield metal layer 26; a copper (Cu) plating layer 30; and a solder resist 32.

In the first embodiment, the silicon oxide film 12 is disposed on a main surface 11 of the semiconductor silicon substrate 10. The titanium nitride (TiN) film 14 is disposed on the silicon oxide film 12. Further, the aluminum (Al) film 16 is disposed on the titanium nitride (TiN) film 14.

In the first embodiment, the through hole 20 is formed to penetrate through the semiconductor silicon substrate 10 from the main surface 11 to a main surface 13 of the semiconductor silicon substrate 10 opposite to the main surface 11. Further, the through hole 20 penetrates through the silicon oxide film 12 and the titanium nitride (TiN) film 14, so that the aluminum (Al) film 16 is exposed at a bottom portion thereof.

In the first embodiment, the CVD oxide film 22 is disposed on a side surface 21 of the through hole 20 and the main surface 13 of the semiconductor silicon substrate 10. Further, the organic insulation film 24 is disposed on the CVD oxide film 22 inside the through hole 20, the CVD oxide film 22 on the main surface 13, and the aluminum (Al) film 16 exposed at the bottom portion of the through hole 20.

In the first embodiment, the shield metal layer 26 is disposed on the organic insulation film 24 on the side surface 21 of the through hole 20, the organic insulation film 24 at the bottom portion of the through hole 20, the organic insulation film 24 on the main surface 13, a sidewall of an opening portion 25 of the organic insulation film 24 at the bottom portion of the through hole 20, and the aluminum (Al) film 16 exposed in the opening portion 25 of the organic insulation film 24.

In the first embodiment, the copper (Cu) plating layer 30 is disposed on the shield metal layer 26 on the organic insulation film 24 of the side surface 21 of the through hole 20, the shield metal layer 26 on the organic insulation film 24 at the bottom portion of the through hole 20, the shield metal layer 26 on the organic insulation film 24 on the main surface 13, the sidewall of the opening portion 25 of the organic insulation film 24 at the bottom portion of the through hole 20, and the shield metal layer 26 disposed on the aluminum (Al) film 16 exposed in the opening portion 25 of the organic insulation film 24. It should be noted that the copper (Cu) plating layer 30 on the main surface 13 has a film thickness greater than a film thickness of the copper (Cu) plating layer 30 on the side surface 21 or at the bottom portion of the through hole 20. It also should be noted that the copper (Cu) plating layer 30 and the shield metal layer 26 constitute a silicon through electrode.

In the first embodiment, the solder resist 32 is disposed on the organic insulation film 24 on the main surface 13 of the semiconductor silicon substrate 10, the copper (Cu) plating layer 30 on the main surface 13, and in an opening portion 31 of the copper (Cu) plating layer 30 inside the through hole 20.

In the first embodiment, a circuit element (not shown) including a semiconductor element such as a MOS (Metal Oxide Semiconductor) transistor is formed on the main surface 11 of the semiconductor silicon substrate 10, and is covered with the silicon oxide film 12. The aluminum (Al) film 16 is provided as a device pad and the like for connecting the semiconductor device 1.

A method of producing the semiconductor device 1 will be explained next with reference to FIGS. 1(A)-1(C) to FIG. 5(A)-5(B).

Figure 1:
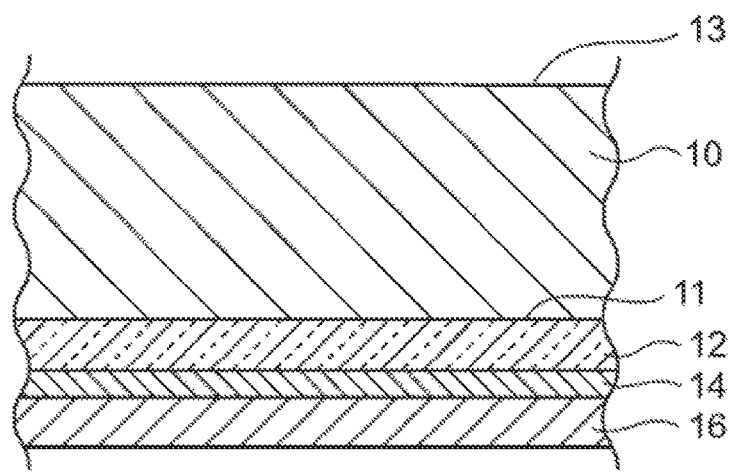
FIGS. 1(A) to 1(C) are schematic vertical sectional views No. 1 showing a method of producing a semiconductor device according to a first embodiment of the present invention.
Figure 1:
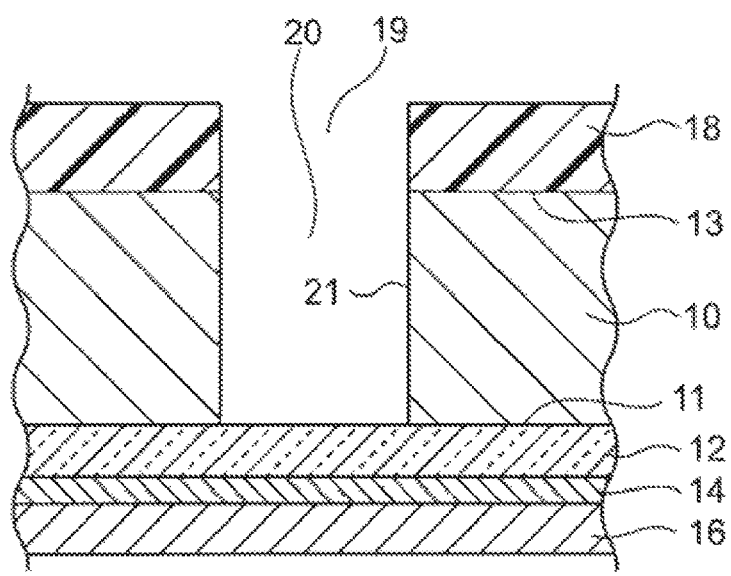
Figure 1:
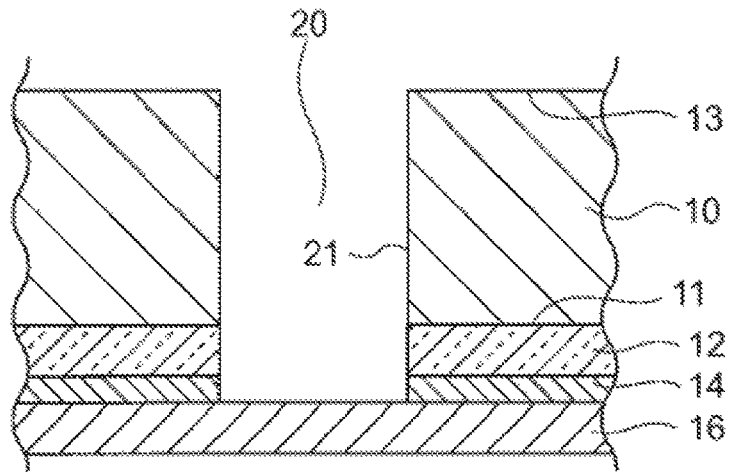
Figure 2:
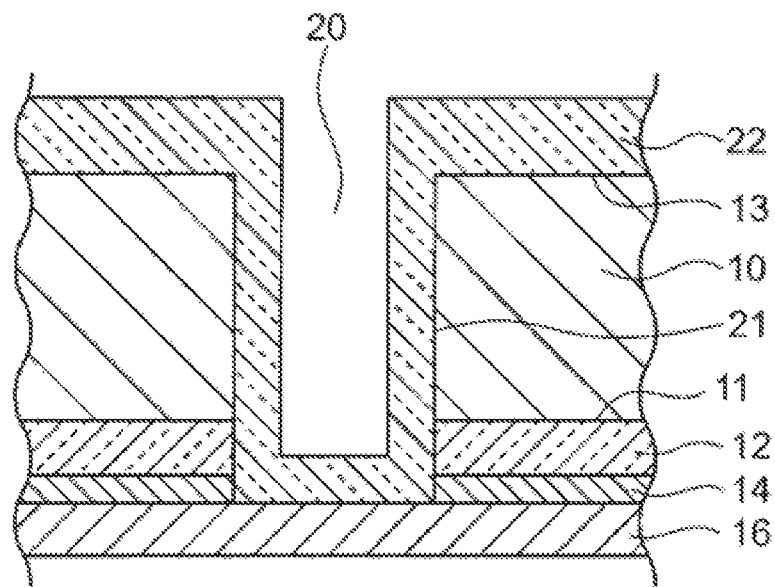
FIGS. 2(A) and 2(B) are schematic vertical sectional views No. 2 showing the method of producing the semiconductor device according to the first embodiment of the present invention.
Figure 2:
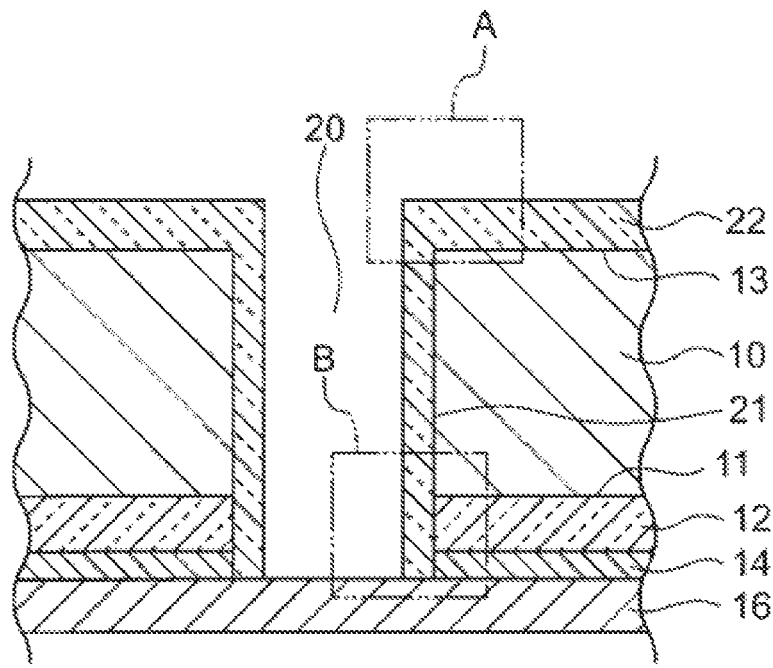
Figure 3:
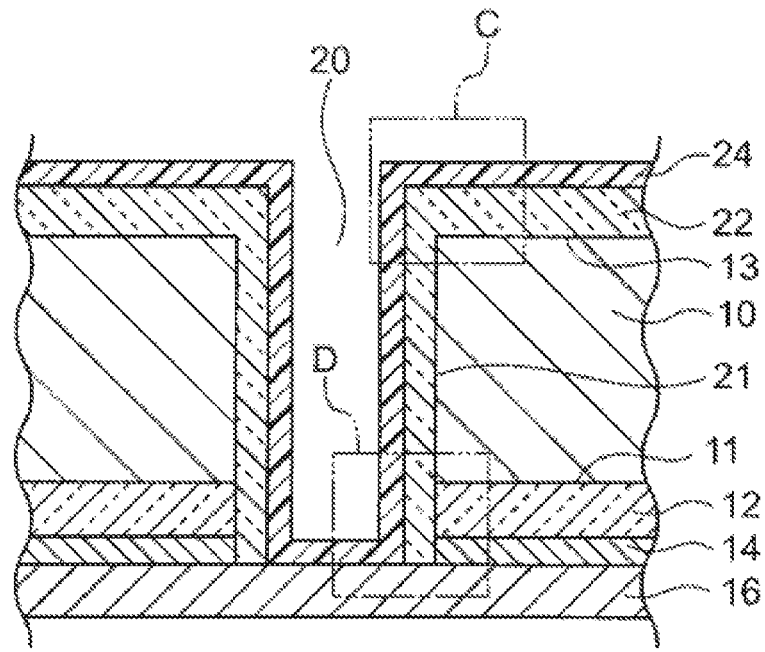
FIGS. 3(A) and 3(B) are schematic vertical sectional views No. 3 showing the method of producing the semiconductor device according to the first embodiment of the present invention.
Figure 3:
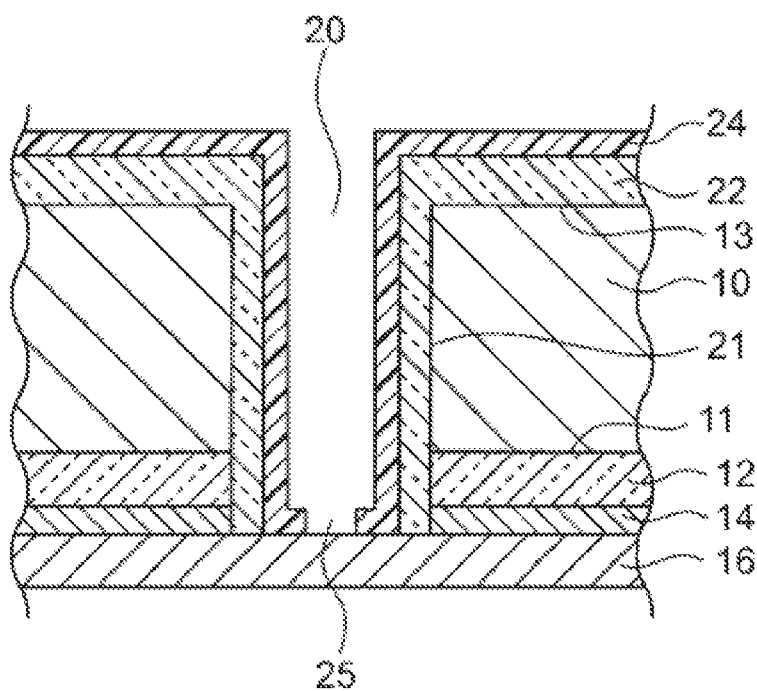
Figure 4:
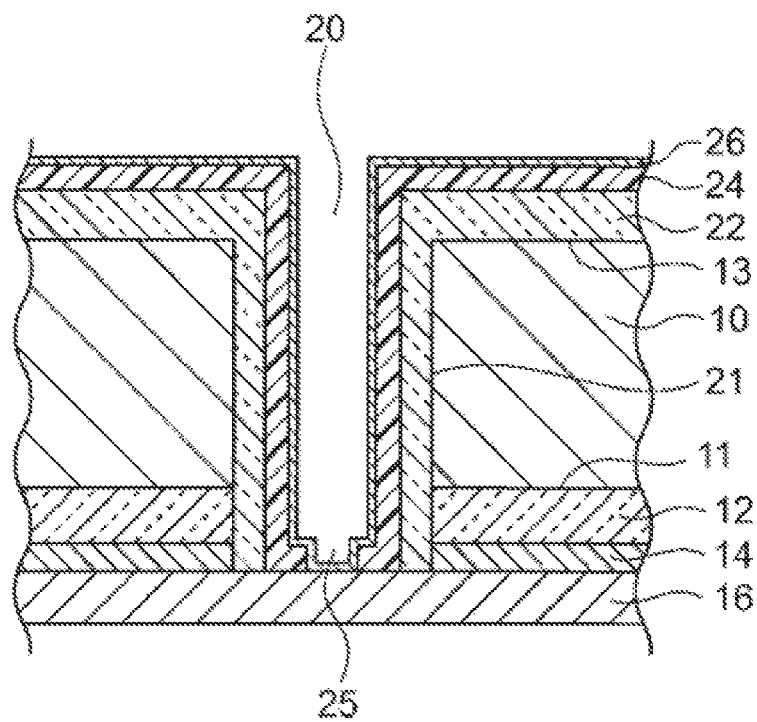
FIGS. 4(A) and 4(B) are schematic vertical sectional views No. 4 showing the method of producing the semiconductor device according to the first embodiment of the present invention.
Figure 4:
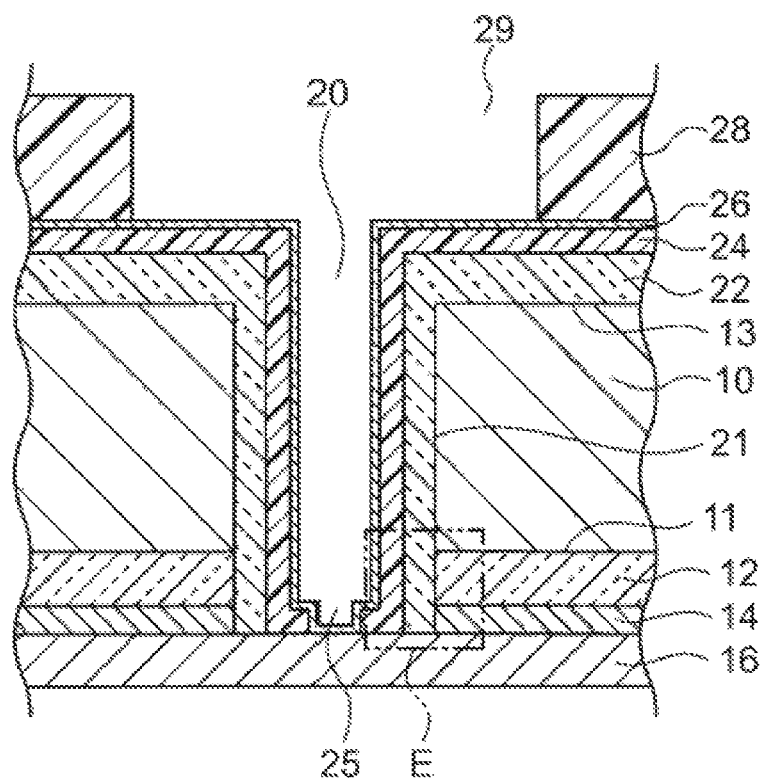

FIGS. 1(A) to 1(C) are schematic vertical sectional views No. 1 showing the method of producing the semiconductor device 1 according to the first embodiment of the present invention. FIGS. 2(A) and 2(B) are schematic vertical sectional views No. 2 showing the method of producing the semiconductor device 1 according to the first embodiment of the present invention. FIGS. 3(A) and 3(B) are schematic vertical sectional views No. 3 showing the method of producing the semiconductor device 1 according to the first embodiment of the present invention. FIGS. 4(A) and 4(B) are schematic vertical sectional views No. 4 showing the method of producing the semiconductor device 1 according to the first embodiment of the present invention. FIGS. 5(A) and 5(B) are schematic vertical sectional views No. 5 showing the method of producing the semiconductor device 1 according to the first embodiment of the present invention.

In the first embodiment, first, the circuit element (not shown) including the semiconductor element such as the MOS (Metal Oxide Semiconductor) transistor is formed on the main surface 11 of the semiconductor silicon substrate 10.

In the next step, as shown in FIG. 1(A), the silicon oxide film 12 is formed on the main surface 11 of the semiconductor silicon substrate 10, and the titanium nitride (TiN) film 14 is formed on the silicon oxide film 12. Further, the aluminum (Al) film 16 is formed on the titanium nitride (TiN) film 14. It should be noted that the titanium nitride (TiN) film 14 is provided for preventing aluminum from migrating.

In the next step, as shown in FIG. 1(B), a resist layer 18 is formed on the main surface 13 of the semiconductor silicon substrate 10 opposite to the main surface 11, and the opening portion 19 is selectively formed in the resist layer 18. Afterward, the semiconductor silicon substrate 10 is etched with the resist layer 18 as a mask, so that the through hole 20 is formed to penetrate through the semiconductor silicon substrate 10 from the main surface 13 to the main surface 11 of the semiconductor silicon substrate 10.

In the next step, as shown in FIG. 1(C), further, the silicon oxide film 12 and the titanium nitride (TiN) film 14 are etched, so that the aluminum (Al) film 16 is exposed at the bottom portion of the through hole 20.

In the next step, as shown in FIG. 2(A), the CVD oxide film 22 is formed on the side surface 21 and the bottom portion of the through hole 20 and the main surface 13 of the semiconductor silicon substrate 10. It should be noted that the CVD oxide film 22 may be formed at a temperature lower than 200° C. as an example.

In the next step, as shown in FIG. 2(B), the CVD oxide film 22 is etched back, so that the aluminum (Al) film 16 is exposed at the bottom surface of the through hole 20.

In the next step, as shown in FIG. 3(A), the organic insulation film 24 is formed on the CVD oxide film 22 inside the through hole 20, the CVD oxide film 22 on the main surface 13, and the aluminum (Al) film 16 exposed at the bottom portion of the through hole 20.

More specifically, when the organic insulation film 24 is formed, first, the semiconductor silicon substrate 10 is placed such that the main surface 11 of the semiconductor silicon substrate 10 faces downwardly, and an organic insulation film solution is coated on the main surface 13. Through this process, the organic insulation film 24 is formed on the CVD oxide film 22 inside the through hole 20, the CVD oxide film 22 on the main surface 13, and the aluminum (Al) film 16 exposed at the bottom portion of the through hole 20. The organic insulation film solution is coated on the main surface 13 through a spin coating process and the like. Afterward, the semiconductor silicon substrate 10 with the organic insulation film solution coated thereon is placed in a vacuum container. Then, the vacuum container is degassed to be in a vacuum state so as to remove an air bubble such as a micro-bubble inside the organic insulation film 24 or an air bubble such as an air pocket between the organic insulation film 24 coated in the through hole 20 and the aluminum (Al) film 16 or the CVD oxide film 22.

In the first embodiment, it may be possible to remove an air bubble in the organic insulation film solution before the organic insulation film solution is coated on the main surface 13, so that the organic insulation film 24 does not contain an air bubble such as a micro-bubble therein. However, when the organic insulation film solution is coated on the main surface 13, an air bubble such as an air pocket may be created between the organic insulation film 24 coated in the through hole 20 and the aluminum (Al) film 16 or the CVD oxide film 22. Accordingly, an air bubble such as an air pocket between the organic insulation film 24 coated in the through hole 20 and the aluminum (Al) film 16 or the CVD oxide film 22 is removed after the organic insulation film solution is coated on the main surface 13.

In the first embodiment, the organic insulation film solution with photosensitivity is coated on the main surface 13 to form the organic insulation film 24. After the air bubble is removed in the vacuum state, the organic insulation film 24 is pre-baked.

In the next step, as shown in FIG. 3(B), the opening portion 25 is formed in the organic insulation film 24 at the bottom portion of the through hole 20, so that the aluminum (Al) film 16 is exposed. More specifically, the organic insulation film 24 is formed from the organic insulation film solution with photosensitivity as described above. Accordingly, the organic insulation film 24 is selectively exposed with light using a photo mask. Afterward, the organic insulation film 24 is developed to form the opening portion 25.

In the next step, as shown in FIG. 4(A), the shield metal layer 26 is formed with a sputter method. More specifically, the shield metal layer 26 is formed on the organic insulation film 24 on the side surface 21 of the through hole 20; the organic insulation film 24 at the bottom portion of the through hole 20; the organic insulation film 24 on the main surface 13; a sidewall of the opening portion 25 formed in the organic insulation film 24 at the bottom portion of the through hole 20; and the aluminum (Al) film 16 exposed in the opening portion 25 of the organic insulation film 24. In this step, titanium (Ti) is sputtered first, and then copper (Cu) is sputtered, so that the shield metal layer 26 is formed.

In the next step, as shown in FIG. 4(B), a dry film 28 is formed, and an opening portion 29 is selectively formed in the dry film 28. Accordingly, the through hole 20 is exposed, and the shield metal layer 26 around the through hole 20 is exposed. It should be noted that if a liquid resist is used instead of the dry film 28, the liquid resist tends to stay in the through hole 20, thereby making it difficult to remove the liquid resist from the through hole 20. For this reason, in the first embodiment, the dry film 28 is used.

In the next step, as shown in FIG. 5(A), the copper (Cu) plating layer 30 is formed with the dry film 28 as a mask. More specifically, the copper (Cu) plating layer 30 is formed on the shield metal layer 26 on the organic insulation film 24 on the side surface 21 of the through hole 20; the shield metal layer 26 on the organic insulation film 24 at the bottom portion of the through hole 20; the shield metal layer 26 on the organic insulation film 24 on the main surface 13; the sidewall of the opening portion 25 of the organic insulation film 24 at the bottom portion of the through hole 20; and the shield metal layer 26 on the aluminum (Al) film 16 exposed in the opening portion 25 of the organic insulation film 24.

In this step, the copper (Cu) plating layer 30 is formed through electrolytic plating using the shield metal layer 26. In the electrolytic plating, an electric current flows through on the main surface 13 more easily than inside the through hole 20. Accordingly, the copper (Cu) plating layer 30 on the main surface 13 has a film thickness greater than that of the copper (Cu) plating layer 30 on the side surface 21 or at the bottom portion of the through hole 20.

In the next step, as shown in FIG. 5(B), the dry film 28 is removed, and then a portion of the shield metal layer 26 not covered with the copper (Cu) plating layer 30 is removed. Afterward, the solder resist 32 is formed on the organic insulation film 24 on the main surface 13 of the semiconductor silicon substrate 10 and the copper (Cu) plating layer 30 on the main surface 13, and in the opening portion 31 of the copper (Cu) plating layer 30 inside the through hole 20.

Comparative Example

A comparative example will be explained next. A method of producing a semiconductor device 3 will be explained next with reference to FIGS. 17(A)-17(C) to FIG. 21.

Figure 18:
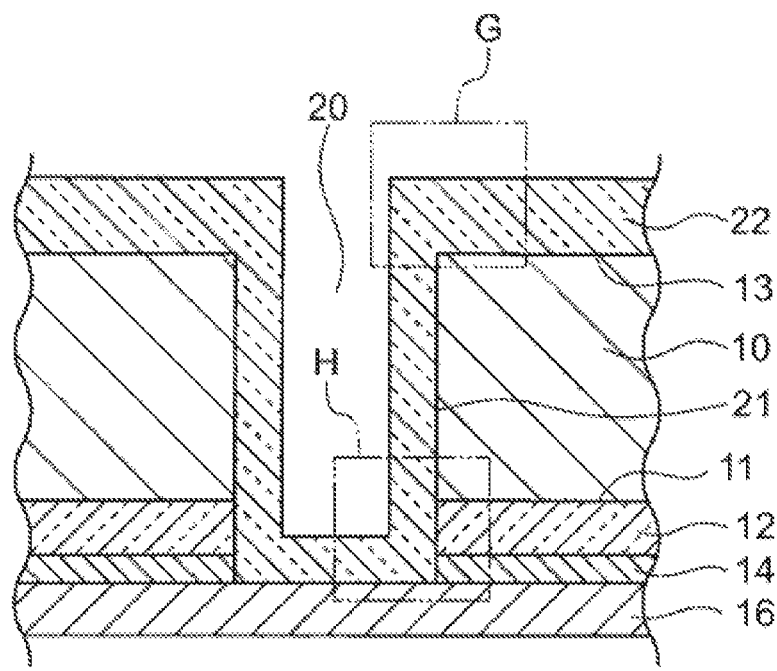
FIGS. 18(A) and 18(B) are schematic vertical sectional views No. 2 showing the method of producing the semiconductor device according to the comparative example.
Figure 18:
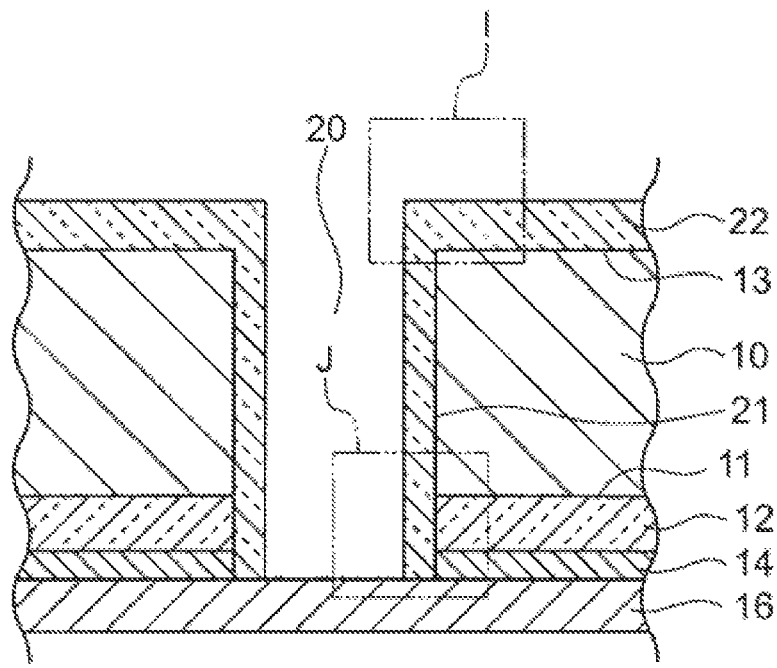
Figure 19:
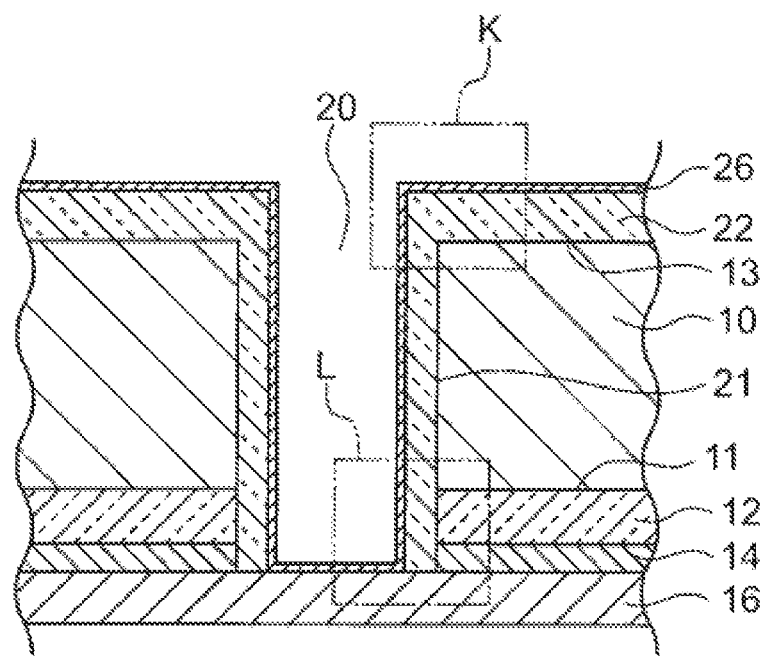
FIGS. 19(A) and 19(B) are schematic vertical sectional views No. 3 showing the method of producing the semiconductor device according to the comparative example.
Figure 19:
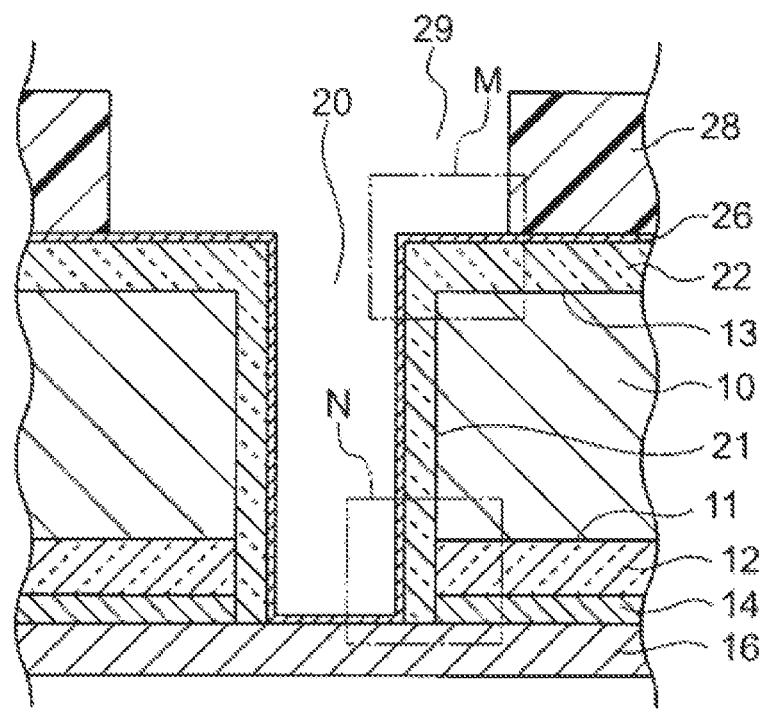
Figure 20:
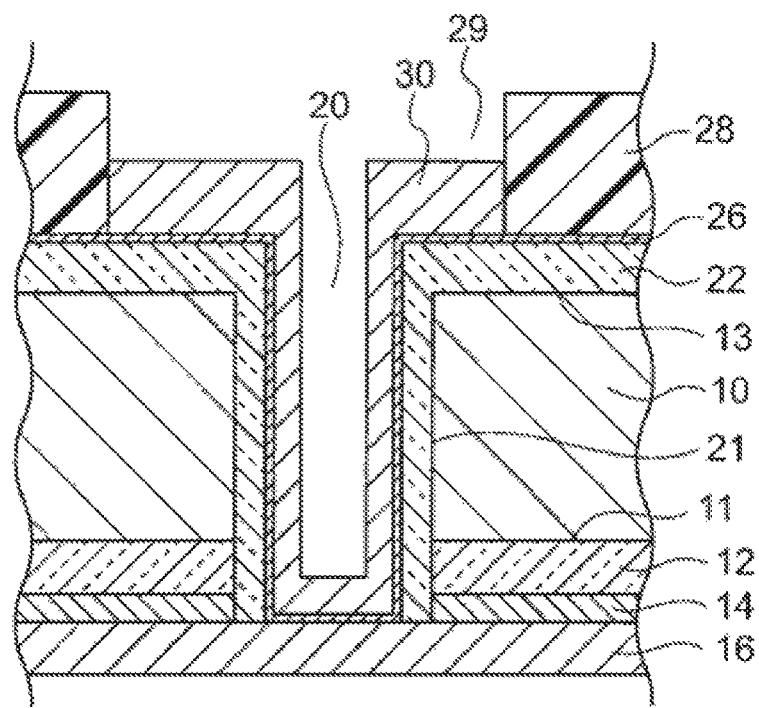
FIGS. 20(A) and 20(B) are schematic vertical sectional views No. 4 showing the method of producing the semiconductor device according to the comparative example.
Figure 20:
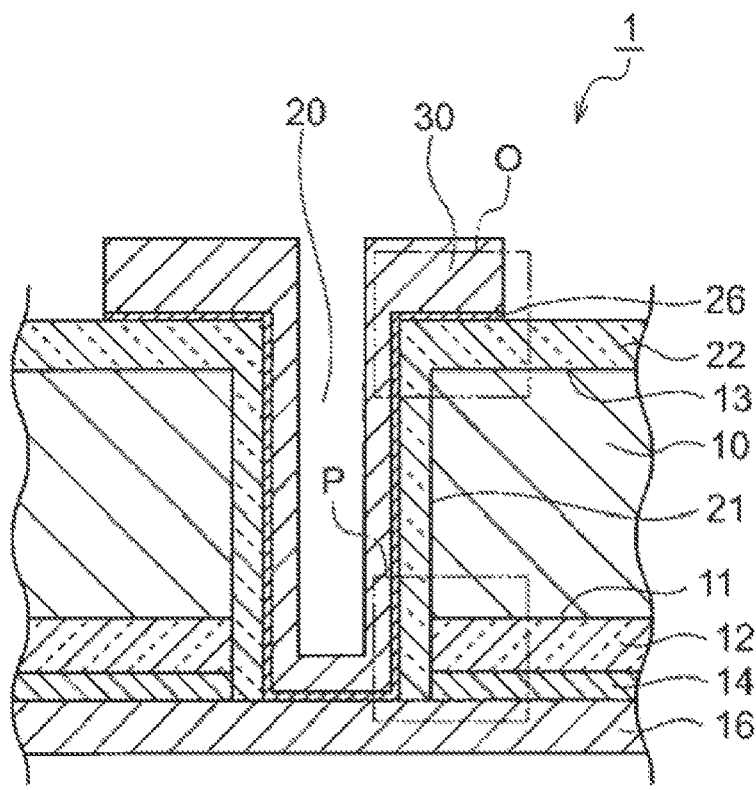
Figure 21:
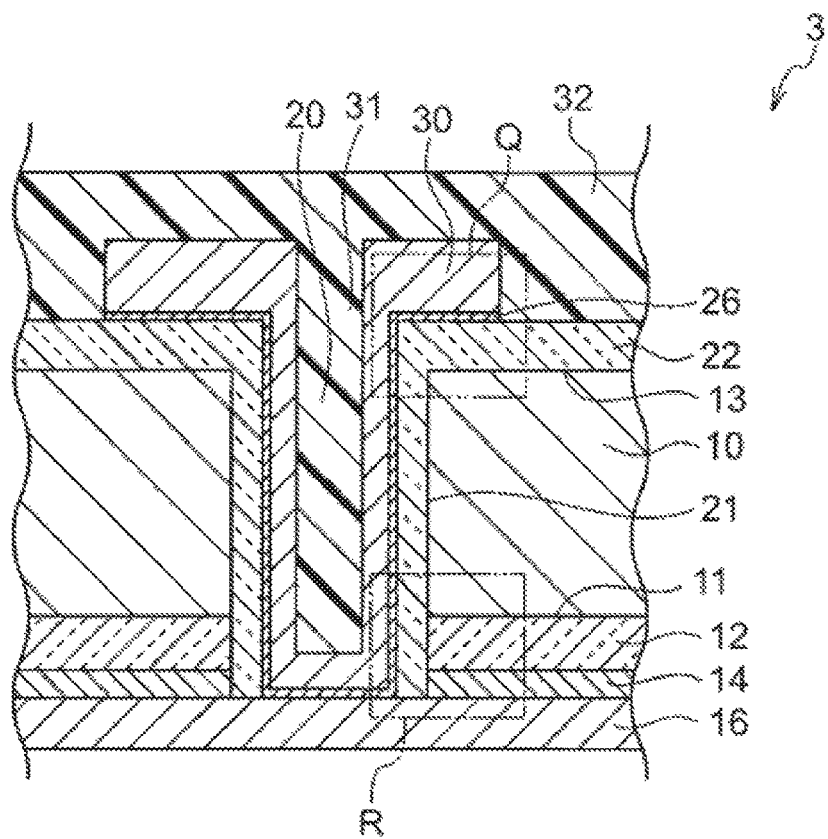
FIG. 21 is a schematic vertical sectional view No. 5 showing the method of producing the semiconductor device according to the comparative example.

FIGS. 17(A) to 17(C) are schematic vertical sectional views No. 1 showing the method of producing the semiconductor device 3 according to the comparative example. FIGS. 18(A) and 18(B) are schematic vertical sectional views No. 2 showing the method of producing the semiconductor device 3 according to the comparative example. FIGS. 19(A) and 19(B) are schematic vertical sectional views No. 3 showing the method of producing the semiconductor device 3 according to the comparative example. FIGS. 20(A) and 20(B) are schematic vertical sectional views No. 4 showing the method of producing the semiconductor device 3 according to the comparative example. FIG. 21 is a schematic vertical sectional view No. 5 showing the method of producing the semiconductor device 3 according to the comparative example;

In the comparative example, first, the circuit element (not shown) including the semiconductor element such as the MOS (Metal Oxide Semiconductor) transistor is formed on the main surface 11 of the semiconductor silicon substrate 10.

In the next step, as shown in FIG. 17(A), the silicon oxide film 12 is formed on the main surface 11 of the semiconductor silicon substrate 10, and the titanium nitride (TiN) film 14 is formed on the silicon oxide film 12. Further, the aluminum (Al) film 16 is formed on the titanium nitride (TiN) film 14.

In the next step, as shown in FIG. 17(B), the resist layer 18 is formed on the main surface 13 of the semiconductor silicon substrate 10 opposite to the main surface 11, and the opening portion 19 is selectively formed in the resist layer 18. Afterward, the semiconductor silicon substrate 10 is etched with the resist layer 18 as a mask, so that the through hole 20 is formed to penetrate through the semiconductor silicon substrate 10 from the main surface 13 to the main surface 11 of the semiconductor silicon substrate 10.

In the next step, as shown in FIG. 17(C), further, the silicon oxide film 12 and the titanium nitride (TiN) film 14 are etched, so that the aluminum (Al) film 16 is exposed at the bottom portion of the through hole 20.

In the next step, as shown in FIG. 18(A), the CVD oxide film 22 is formed on the side surface 21 and the bottom portion of the through hole 20 and the main surface 13 of the semiconductor silicon substrate 10.

In the next step, as shown in FIG. 18(B), the CVD oxide film 22 is etched back, so that the aluminum (Al) film 16 is exposed at the bottom surface of the through hole 20.

In the next step, as shown in FIG. 19(A), the shield metal layer 26 is formed with a sputter method. More specifically, the shield metal layer 26 is formed on the CVD oxide film 22 on the side surface 21 of the through hole 20; the CVD oxide film 22 on the main surface 13; and the aluminum (Al) film 16 exposed at the bottom portion of the through hole 20. In this step, titanium (Ti) is sputtered first, and then copper (Cu) is sputtered, so that the shield metal layer 26 is formed.

In the next step, as shown in FIG. 19(B), the dry film 28 is formed, and the opening portion 29 is selectively formed in the dry film 28. Accordingly, the through hole 20 is exposed, and the shield metal layer 26 around the through hole 20 is exposed.

In the next step, as shown in FIG. 20(A), the copper (Cu) plating layer 30 is formed with the dry film 28 as a mask. More specifically, the copper (Cu) plating layer 30 is formed on the shield metal layer 26 on the CVD oxide film 22 on the side surface 21 of the through hole 20, and the shield metal layer 26 on the aluminum (Al) film 16 exposed at the bottom portion of the through hole 20. In this step, the copper (Cu) plating layer 30 is formed through electrolytic plating using the shield metal layer 26.

In the next step, as shown in FIG. 20(B), the dry film 28 is removed, and then a portion of the shield metal layer 26 not covered with the copper (Cu) plating layer 30 is removed.

In the next step, as shown in FIG. 21, the solder resist 32 is formed on the CVD oxide film 22 on the main surface 13 of the semiconductor silicon substrate 10 and the copper (Cu) plating layer 30 on the main surface 13, and in the opening portion 31 of the copper (Cu) plating layer 30 inside the through hole 20.

Comparison Between First Embodiment and Comparative Example

A comparison between the first embodiment and the comparative example will be explained next with reference to FIGS. 1(A)-1(C) to 11 and 17(A)-17(C) to 33.

Figure 6:
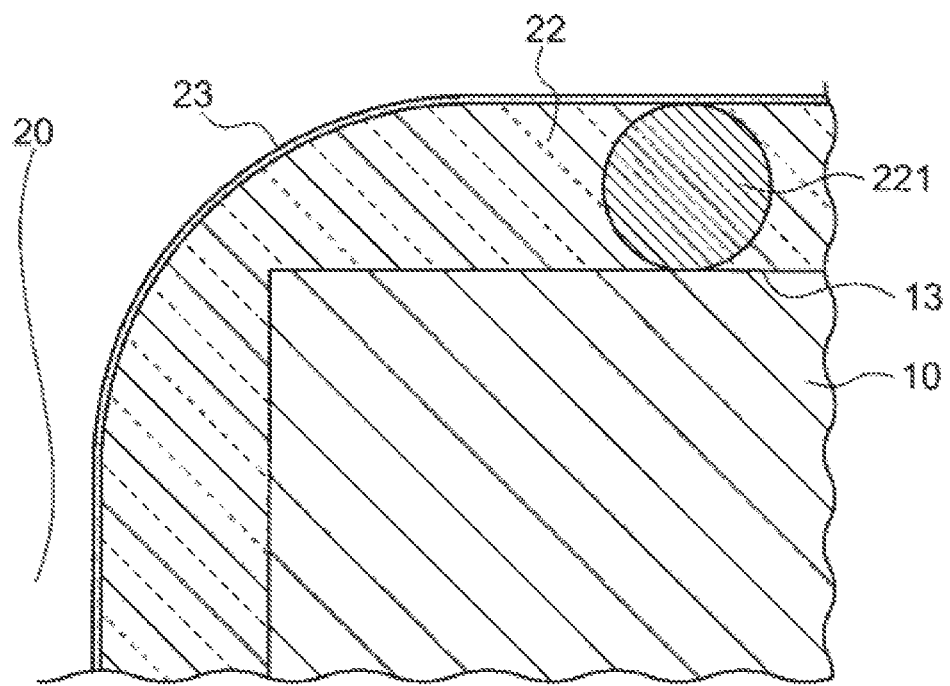
FIG. 6 is an enlarged partial schematic vertical sectional view showing a portion A in FIG. 2(B) according to the first embodiment of the present invention.
Figure 7:
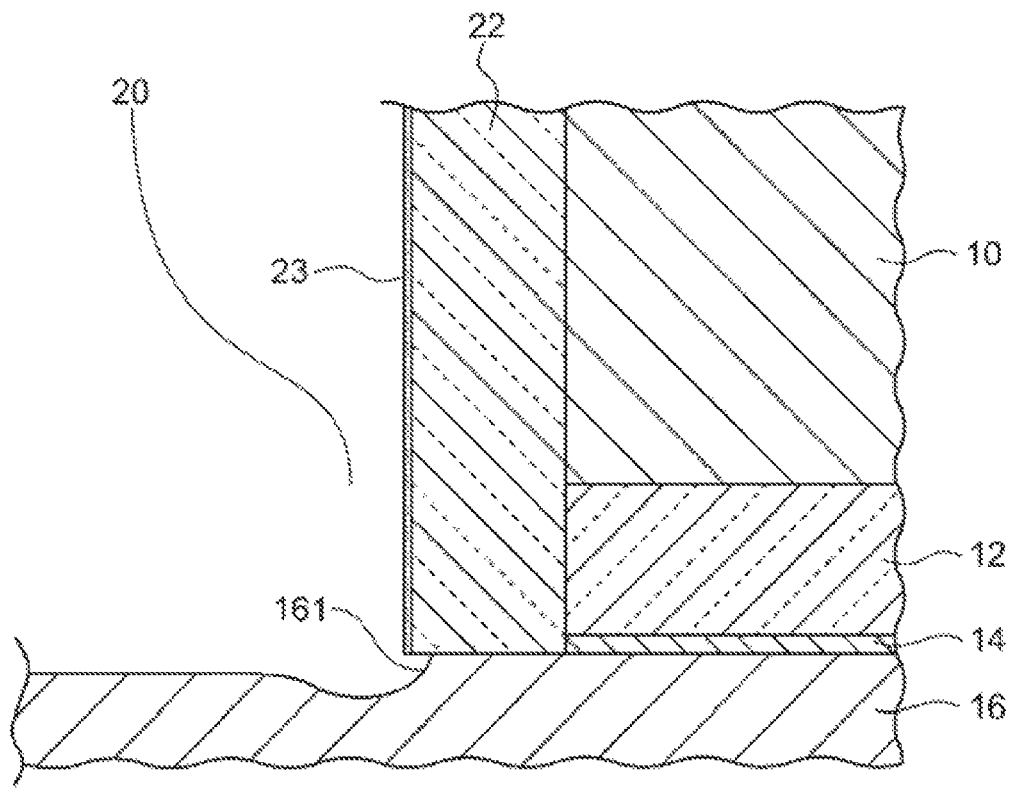
FIG. 7 is an enlarged partial schematic vertical sectional view showing a portion B in FIG. 2(B) according to the first embodiment of the present invention.
Figure 8:
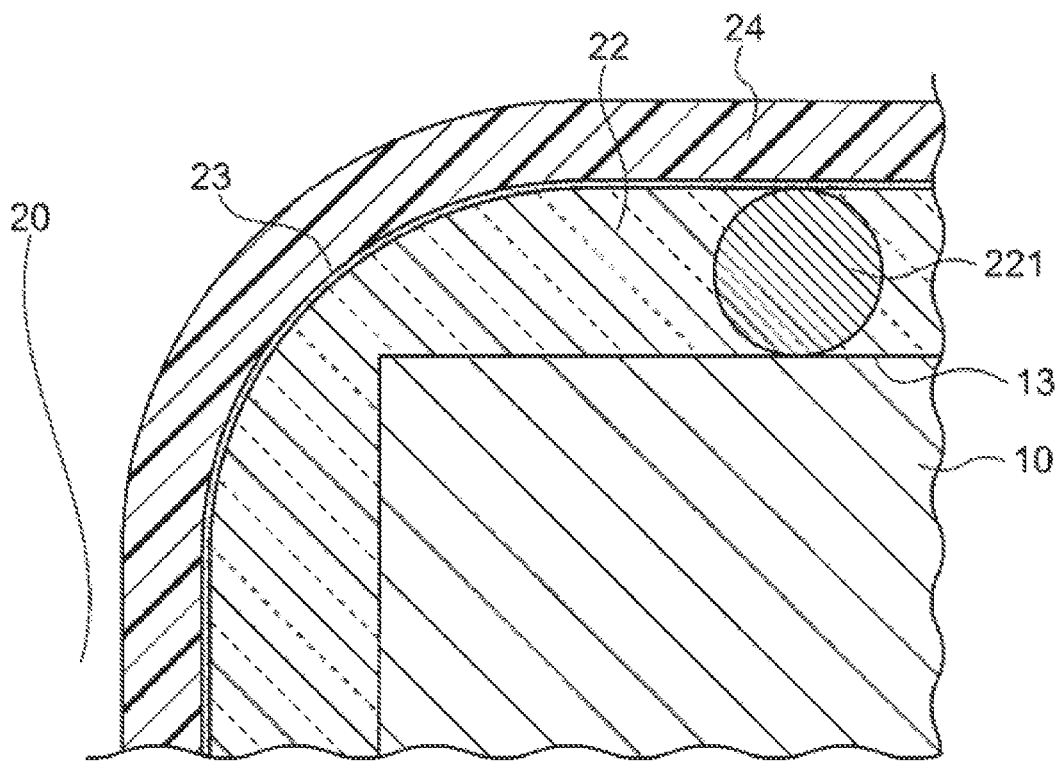
FIG. 8 is an enlarged partial schematic vertical sectional view showing a portion C in FIG. 3(A) according to the first embodiment of the present invention.
Figure 9:
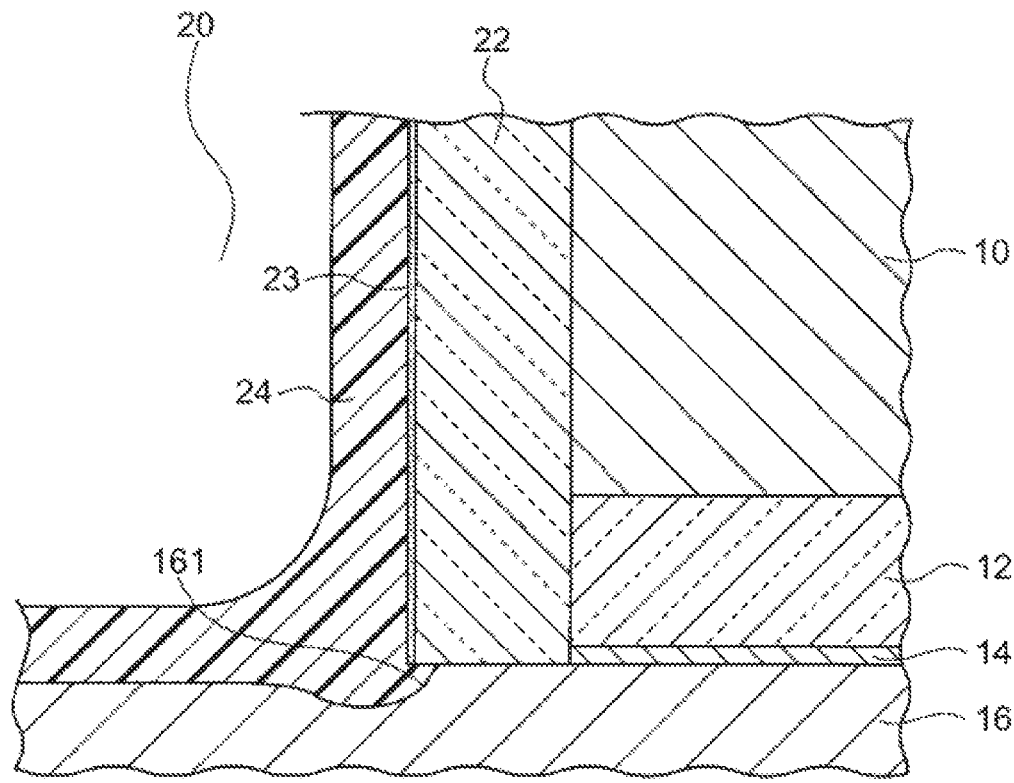
FIG. 9 is an enlarged partial schematic vertical sectional view showing a portion D in FIG. 3(A) according to the first embodiment of the present invention.
Figure 10:
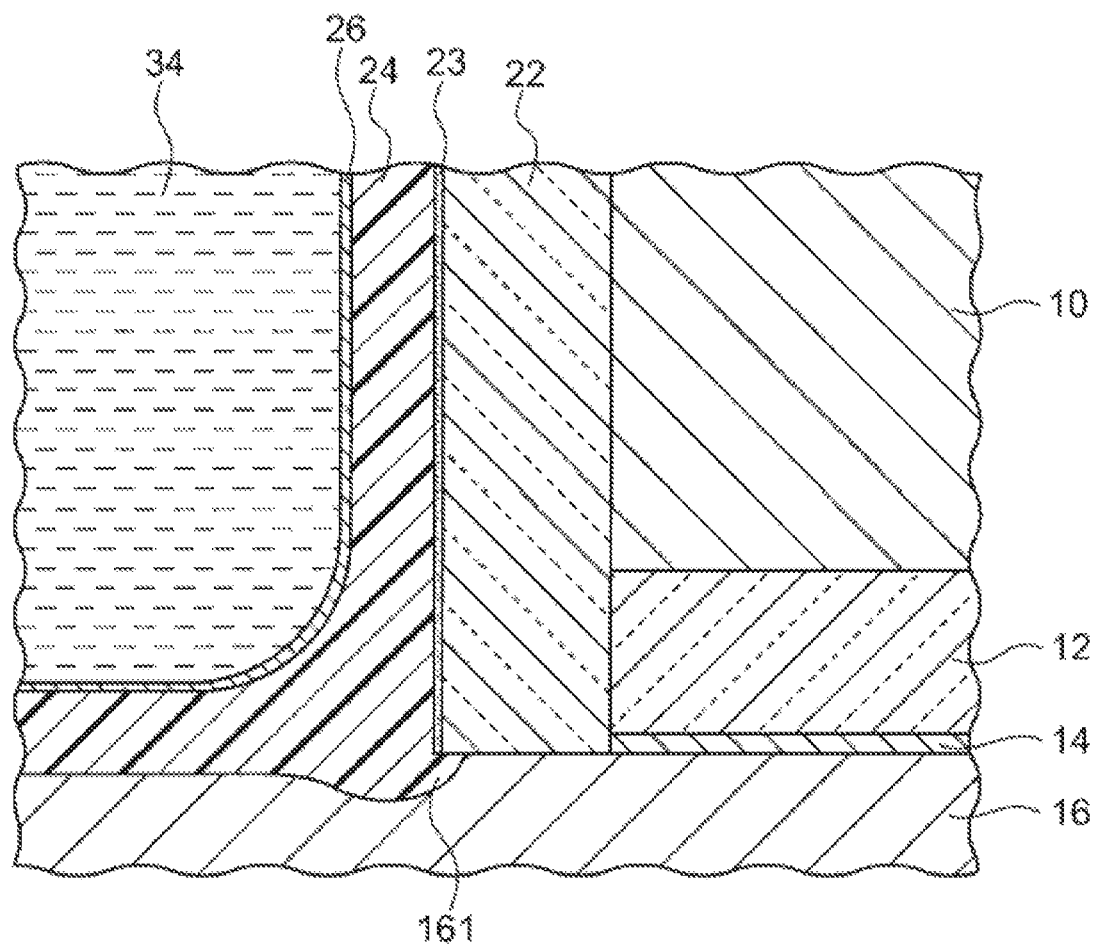
FIG. 10 is an enlarged partial schematic vertical sectional view showing a portion E in FIG. 4(B) according to the first embodiment of the present invention.
Figure 11:
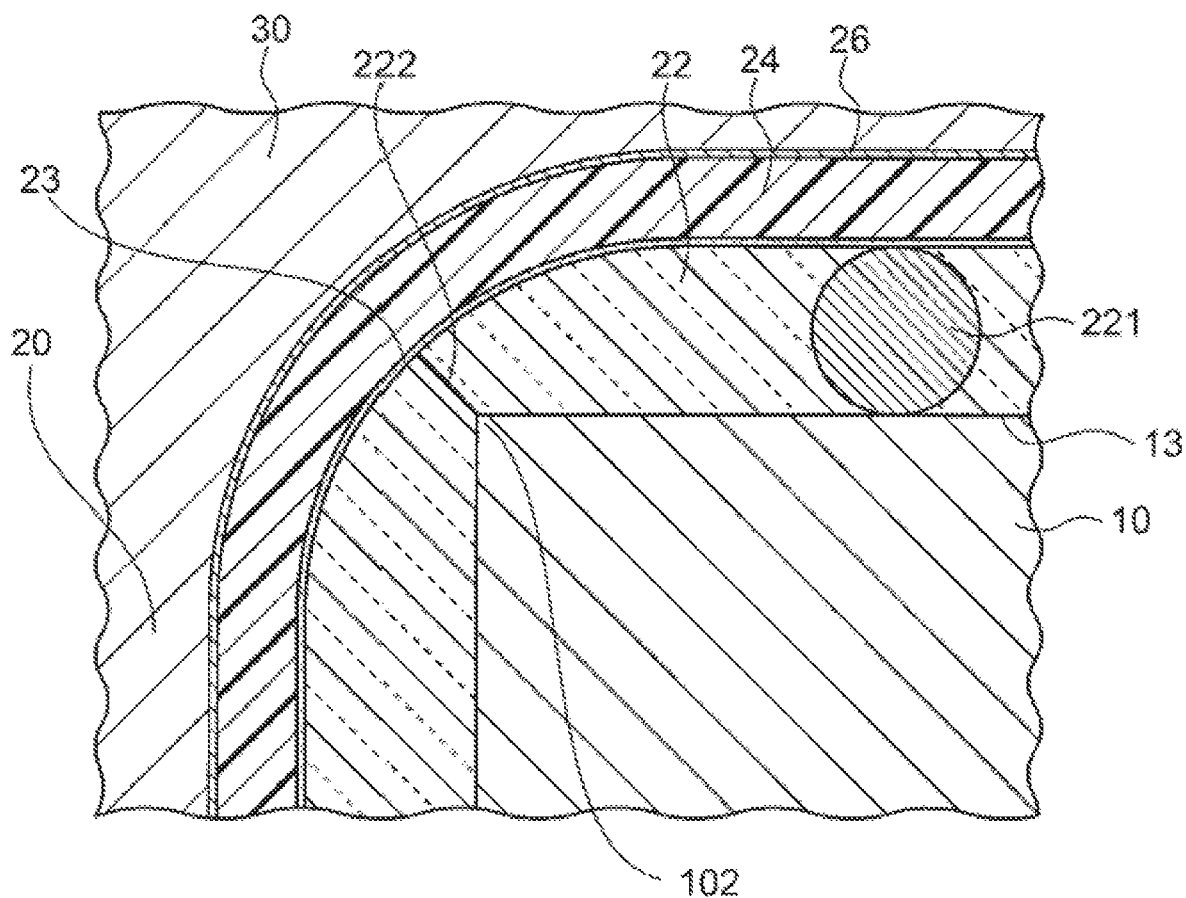
FIG. 11 is an enlarged partial schematic vertical sectional view showing a portion F in FIG. 5(B) according to the first embodiment of the present invention.

FIG. 6 is an enlarged partial schematic vertical sectional view showing a portion A in FIG. 2(B) according to the first embodiment of the present invention. FIG. 7 is an enlarged partial schematic vertical sectional view showing a portion B in FIG. 2(B) according to the first embodiment of the present invention. FIG. 8 is an enlarged partial schematic vertical sectional view showing a portion C in FIG. 3(A) according to the first embodiment of the present invention. FIG. 9 is an enlarged partial schematic vertical sectional view showing a portion D in FIG. 3(A) according to the first embodiment of the present invention. FIG. 10 is an enlarged partial schematic vertical sectional view showing a portion E in FIG. 4(B) according to the first embodiment of the present invention. FIG. 11 is an enlarged partial schematic vertical sectional view showing a portion F in FIG. 5(B) according to the first embodiment of the present invention.

Figure 22:
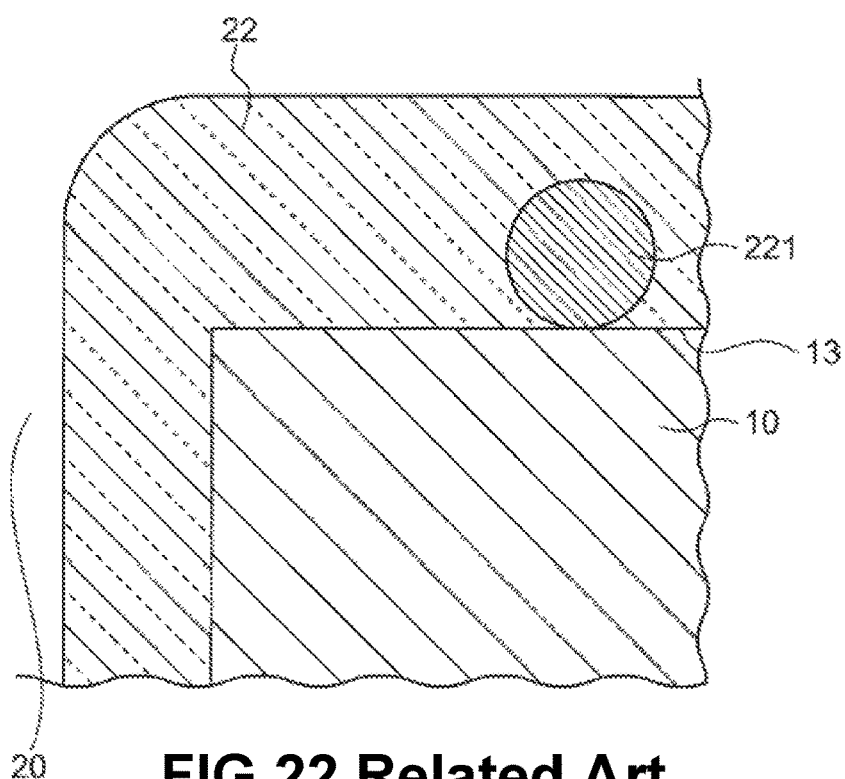
FIG. 22 is an enlarged partial schematic vertical sectional view showing a portion G in FIG. 18(A) according to the comparative example.
Figure 23:
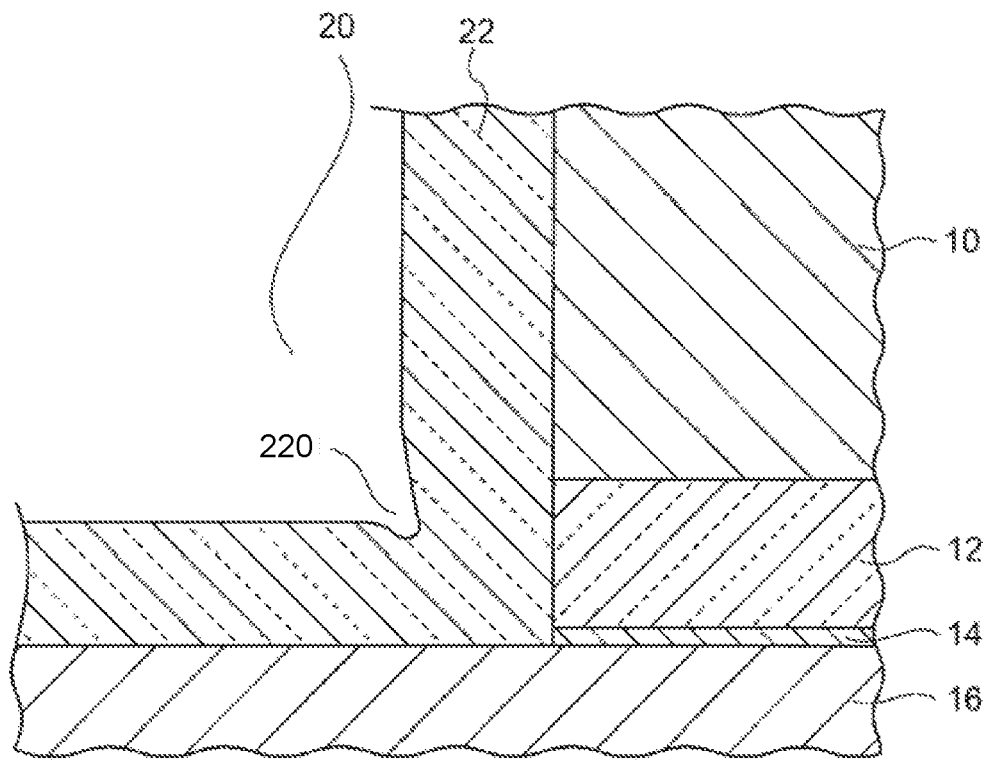
FIG. 23 is an enlarged partial schematic vertical sectional view showing a portion H in FIG. 18(A) according to the comparative example.
Figure 24:
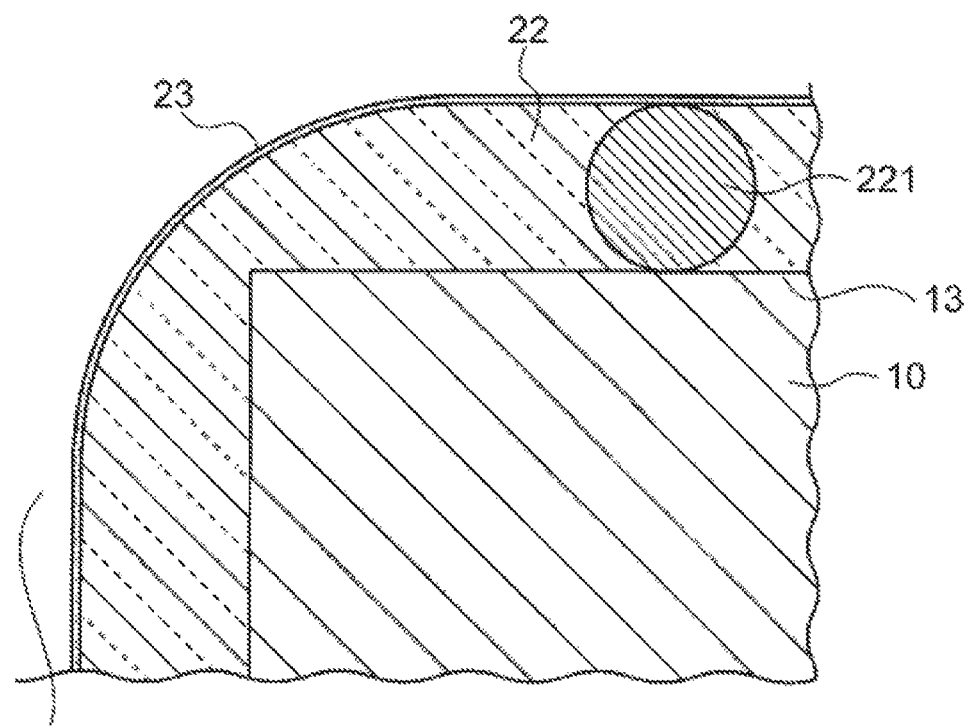
FIG. 24 is an enlarged partial schematic vertical sectional view showing a portion I in FIG. 18(B) according to the comparative example.
Figure 25:
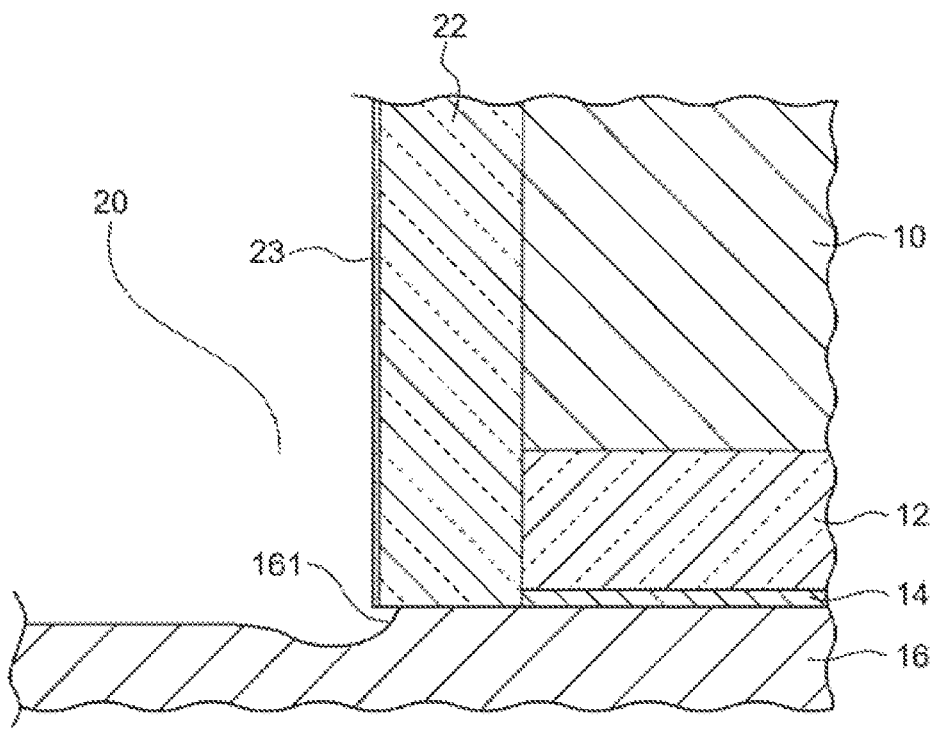
FIG. 25 is an enlarged partial schematic vertical sectional view showing a portion J in FIG. 18(B) according to the comparative example.
Figure 26:
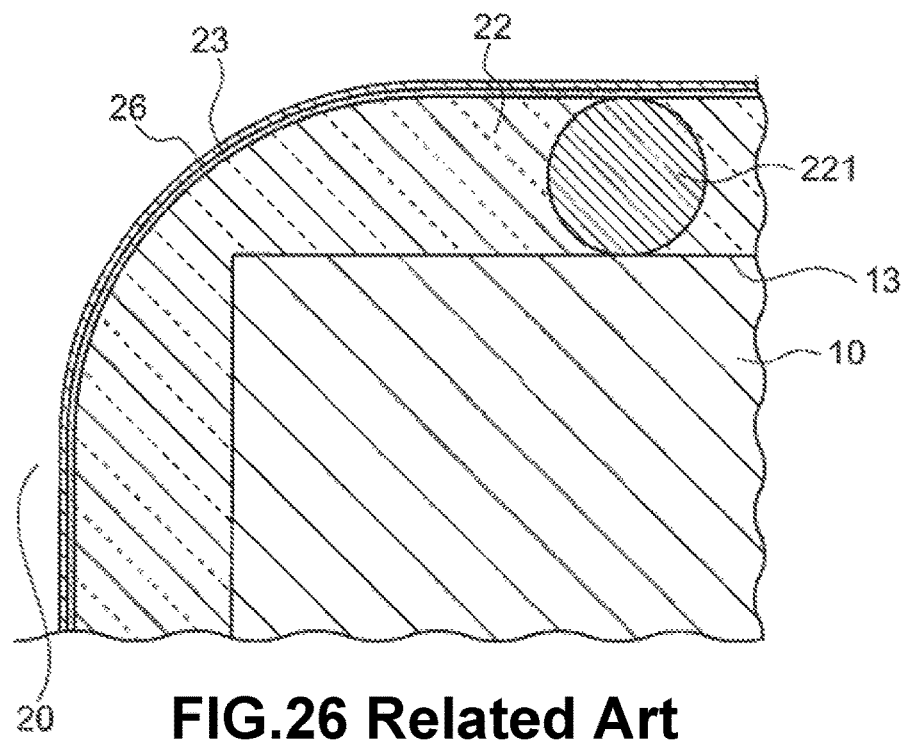
FIG. 26 is an enlarged partial schematic vertical sectional view showing a portion K in FIG. 19(A) according to the comparative example.

FIG. 21 is a schematic vertical sectional view No. 5 showing the method of producing the semiconductor device according to the comparative example. FIG. 22 is an enlarged partial schematic vertical sectional view showing a portion G in FIG. 18(A) according to the comparative example. FIG. 23 is an enlarged partial schematic vertical sectional view showing a portion H in FIG. 18(A) according to the comparative example. FIG. 24 is an enlarged partial schematic vertical sectional view showing a portion I in FIG. 18(B) according to the comparative example. FIG. 25 is an enlarged partial schematic vertical sectional view showing a portion J in FIG. 18(B) according to the comparative example. FIG. 26 is an enlarged partial schematic vertical sectional view showing a portion K in FIG. 19(A) according to the comparative example.

Figure 27:
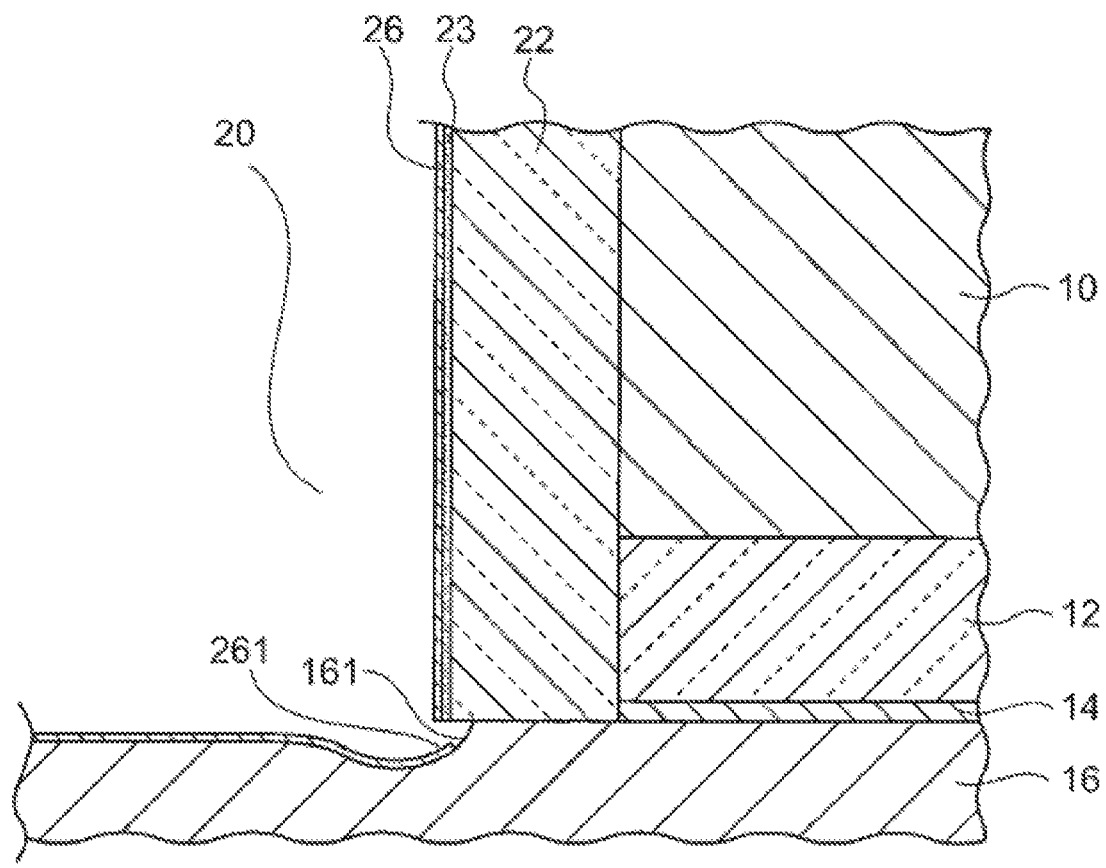
FIG. 27 is an enlarged partial schematic vertical sectional view showing a portion L in FIG. 19(A) according to the comparative example.
Figure 28:
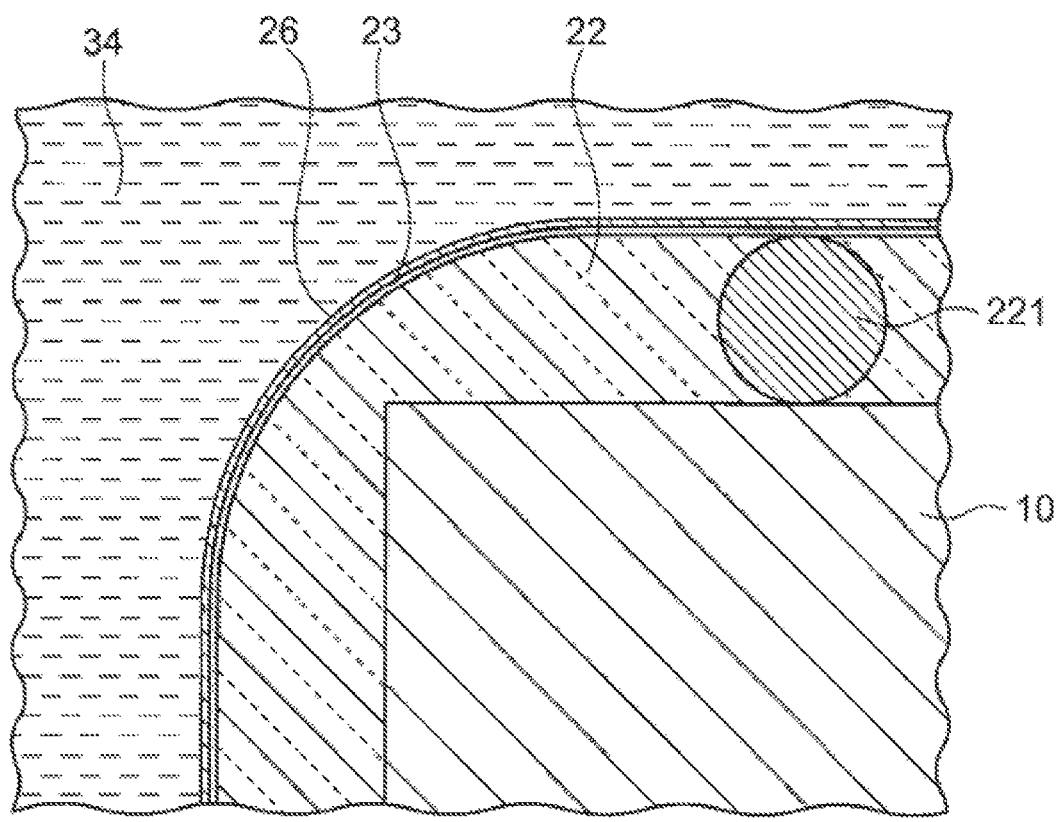
FIG. 28 is an enlarged partial schematic vertical sectional view showing a portion M in FIG. 19(B) according to the comparative example.
Figure 29:
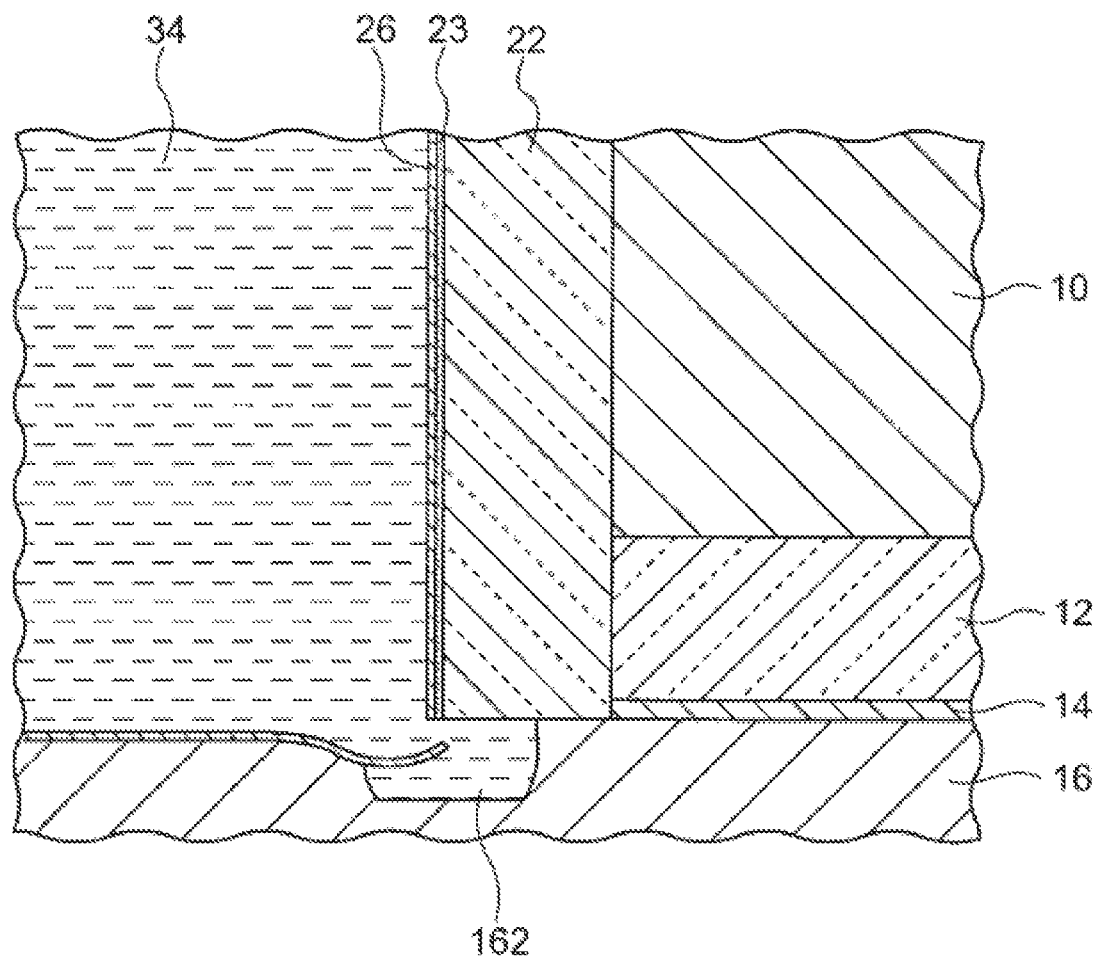
FIG. 29 is an enlarged partial schematic vertical sectional view showing a portion N in FIG. 19(B) according to the comparative example.
Figure 30:
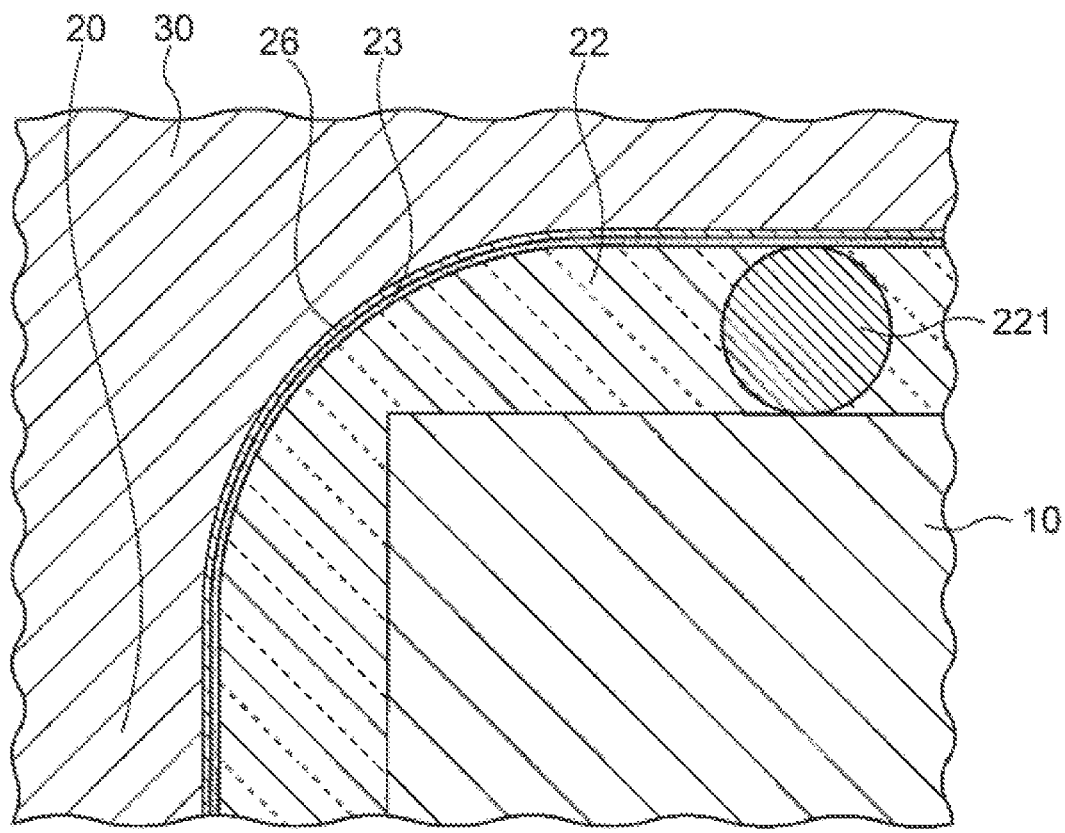
FIG. 30 is an enlarged partial schematic vertical sectional view showing a portion O in FIG. 20(B) according to the comparative example.
Figure 31:
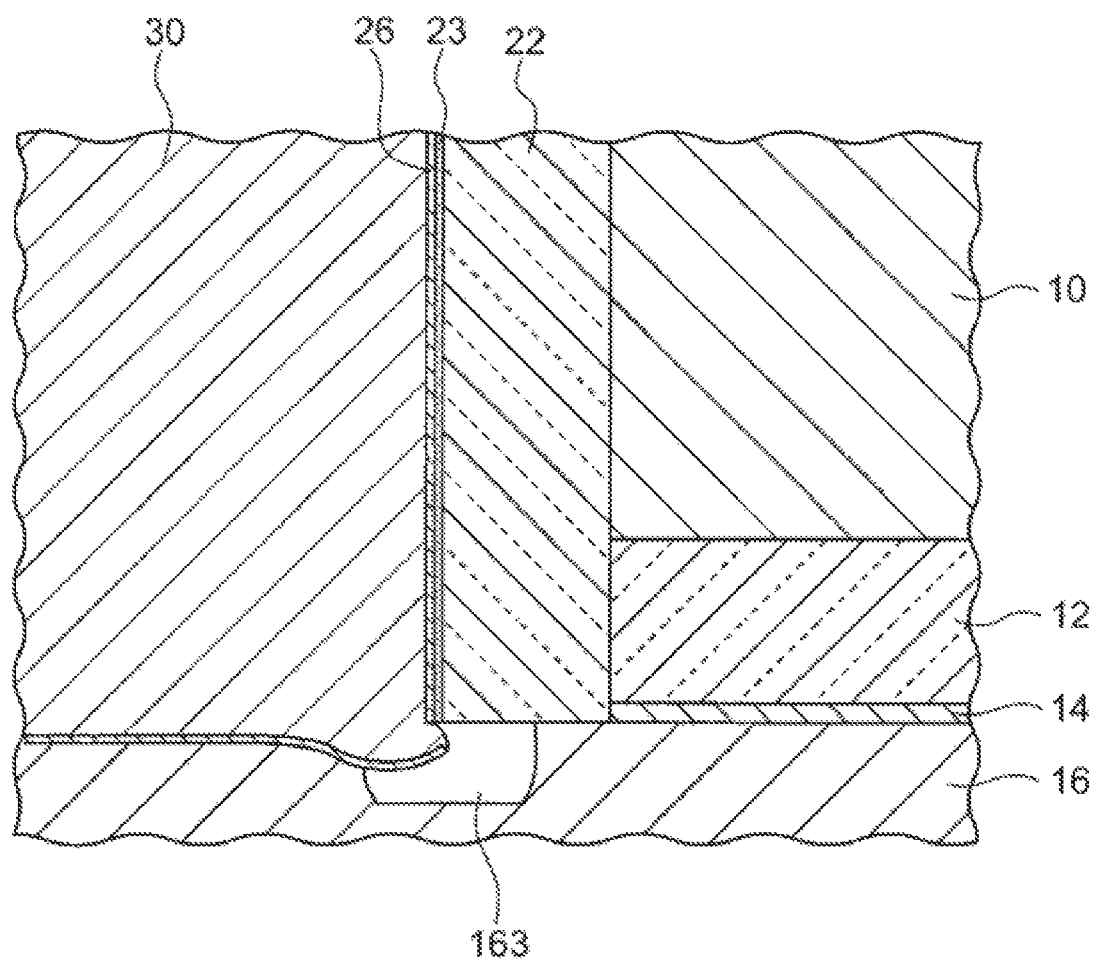
FIG. 31 is an enlarged partial schematic vertical sectional view showing a portion P in FIG. 20(B) according to the comparative example.
Figure 32:
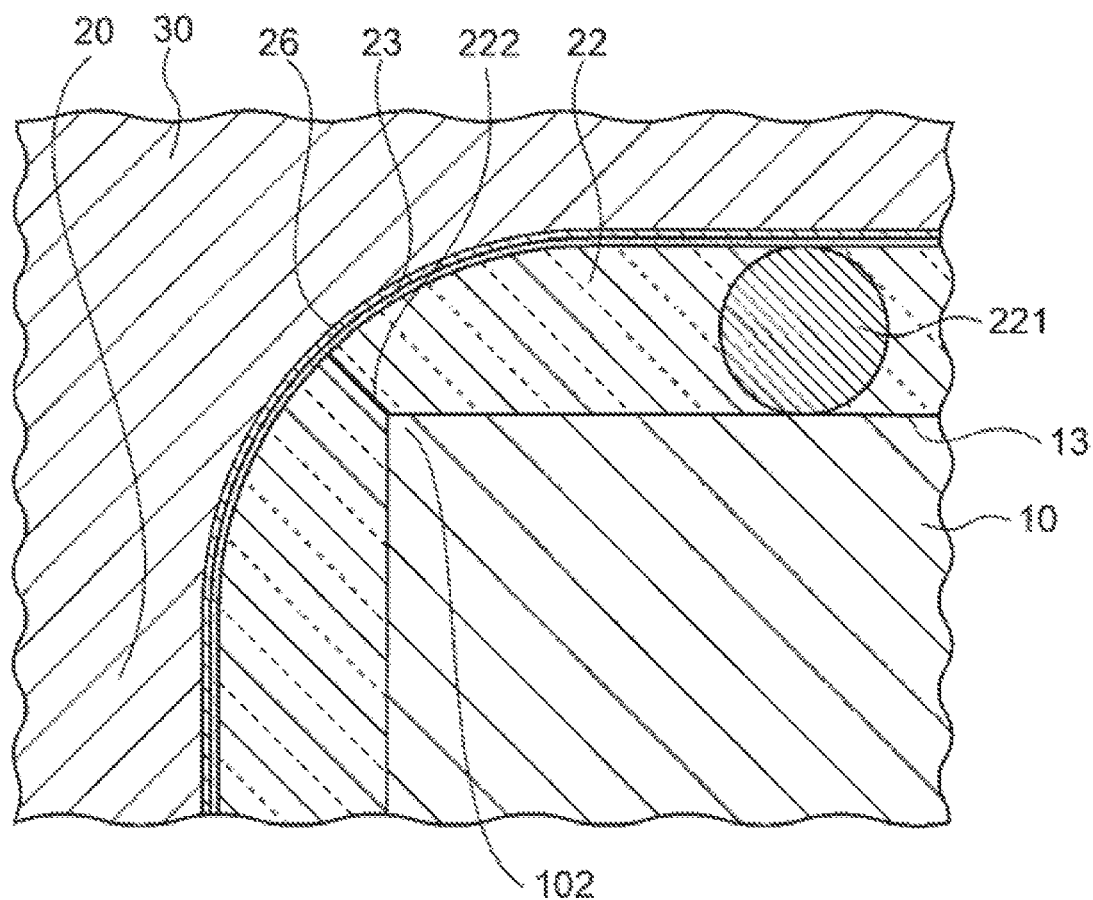
FIG. 32 is an enlarged partial schematic vertical sectional view showing a portion Q in FIG. 21 according to the comparative example.
Figure 33:
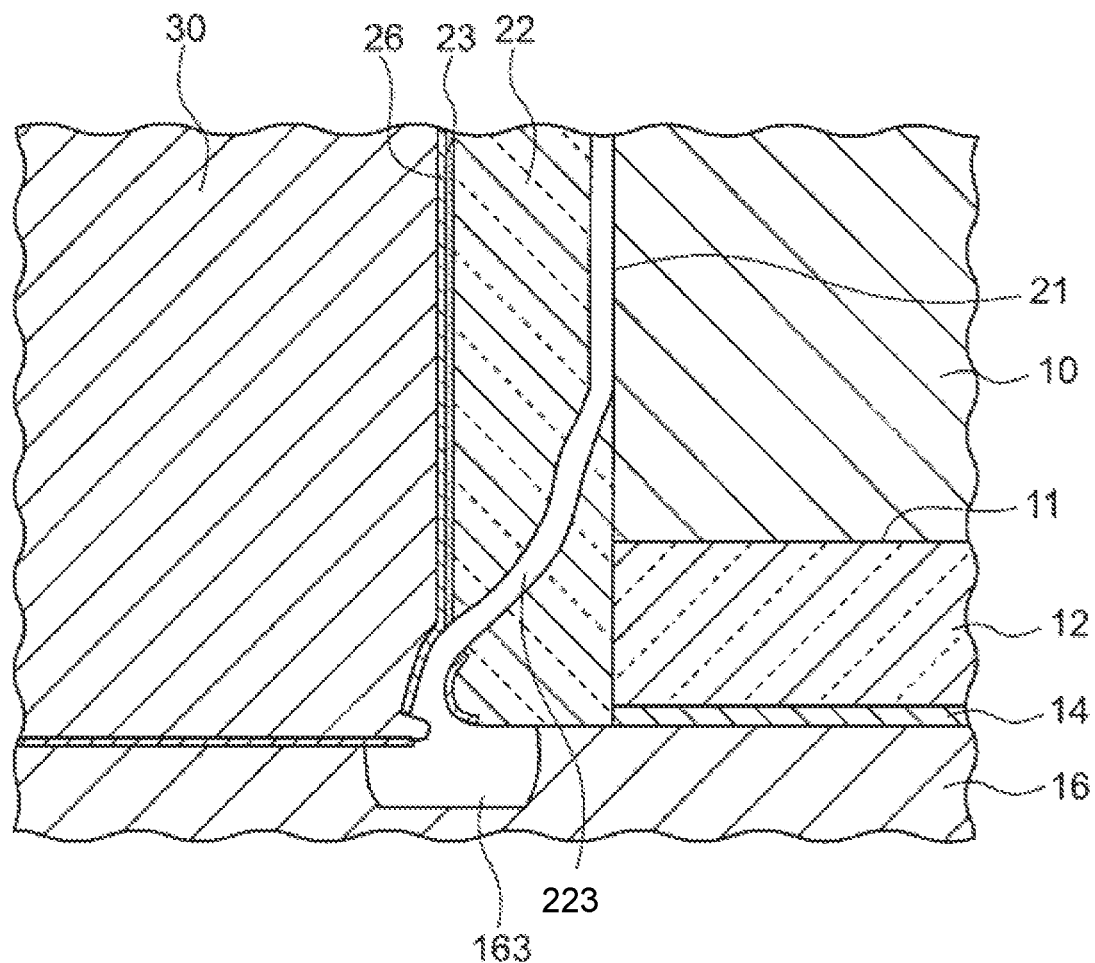
FIG. 33 is an enlarged partial schematic vertical sectional view showing a portion R in FIG. 21 according to the comparative example.

Further, FIG. 27 is an enlarged partial schematic vertical sectional view showing a portion L in FIG. 19(A) according to the comparative example. FIG. 28 is an enlarged partial schematic vertical sectional view showing a portion M in FIG. 19(B) according to the comparative example. FIG. 29 is an enlarged partial schematic vertical sectional view showing a portion N in FIG. 19(B) according to the comparative example. FIG. 30 is an enlarged partial schematic vertical sectional view showing a portion O in FIG. 20(B) according to the comparative example. FIG. 31 is an enlarged partial schematic vertical sectional view showing a portion P in FIG. 20(B) according to the comparative example. FIG. 32 is an enlarged partial schematic vertical sectional view showing a portion Q in FIG. 21 according to the comparative example. FIG. 33 is an enlarged partial schematic vertical sectional view showing a portion R in FIG. 21 according to the comparative example.

As shown in FIG. 2(A) and FIG. 18(A), when the CVD oxide film 22 is formed on the side surface 21 and the bottom portion of the through hole 20 and the main surface 13 of the semiconductor silicon substrate 10, the CVD oxide film 22 formed on the main surface 13 of the semiconductor silicon substrate 10 tends to have a larger thickness than that of the CVD oxide film 22 formed at the bottom portion of the through hole 20 due to a flowing around effect of a raw material gas used in the CVD process. Further, as shown in FIG. 23, a dimple portion 220 is created at a corner of the bottom portion of the through hole 20. Further, as shown in FIG. 22, a particle 221 may be embedded in the CVD oxide film 22 on the main surface 13 of the semiconductor silicon substrate 10.

As shown in FIG. 2(B) and FIG. 18(B), when the CVD oxide film 22 is etched back through a dry-etching process, the CVD oxide film 22 formed at the bottom portion of the through hole 20 is removed, and the aluminum (Al) film 16 is exposed at the bottom surface of the through hole 20. When the CVD oxide film 22 is etched back, an ashing process and an organic substance removal cleaning process are performed. In the ashing process and the organic substance removal cleaning process, an undercut may be created in the aluminum (Al) film 16 due to a cleaning liquid. Together with the effect of the dimple portion 220 formed in the CVD oxide film 22, as shown in FIG. 7 and FIG. 25, a dimple portion 161 is created in the aluminum (Al) film 16 at the corner of the bottom portion of the through hole 20.

Figure 12:
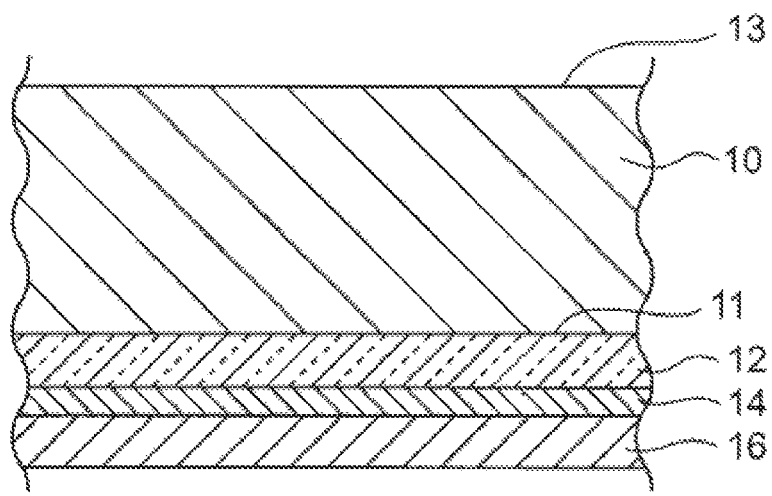
FIGS. 12(A) to 12(C) are schematic vertical sectional views No. 1 showing a method of producing a semiconductor device according to a second embodiment of the present invention.
Figure 12:
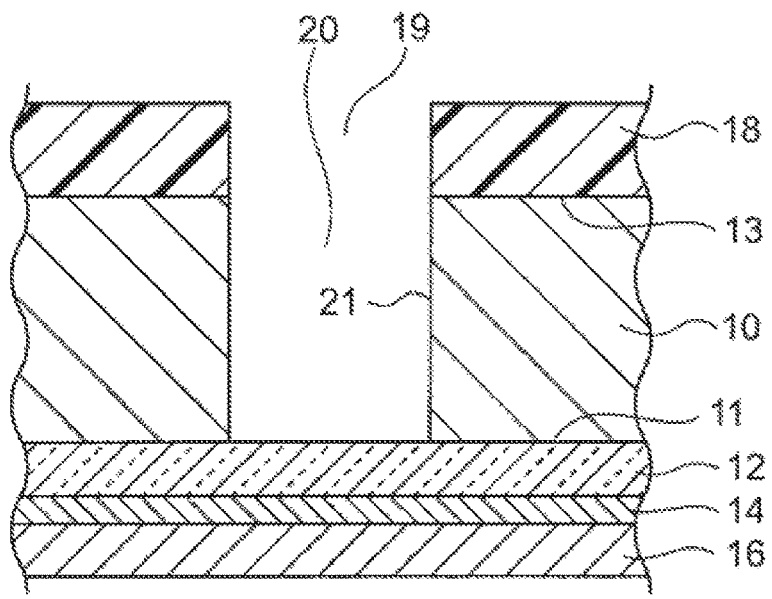
Figure 12:
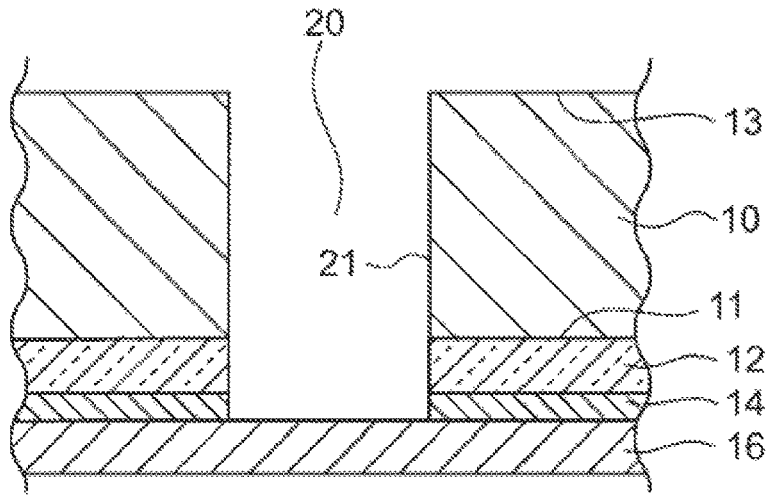
Figure 13:
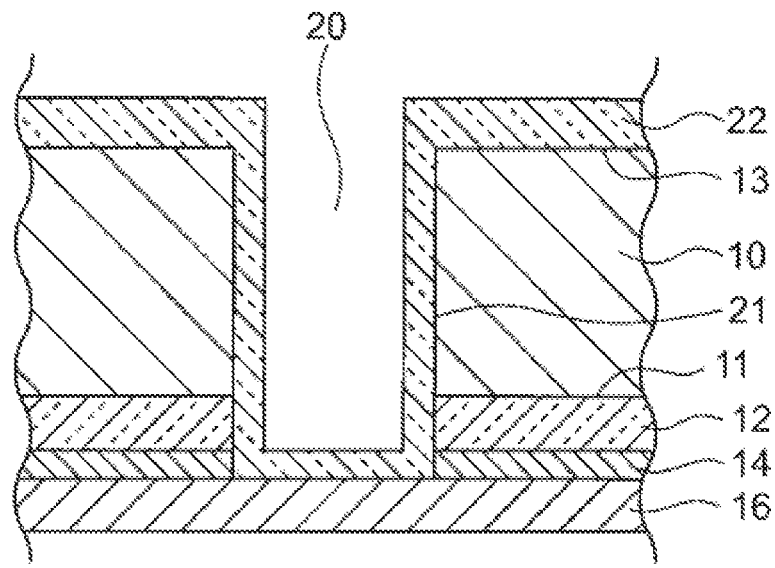
FIGS. 13(A) and 13(B) are schematic vertical sectional views No. 2 showing the method of producing the semiconductor device according to the second embodiment of the present invention.
Figure 13:
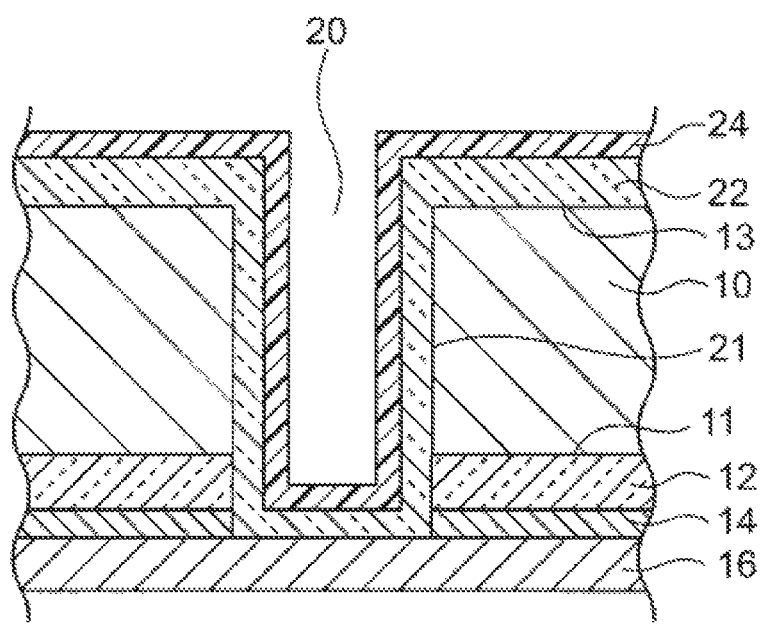

Further, as shown in FIGS. 12 and 13, a damaged layer 23 is formed on the surface of the CVD oxide film 22 during the dry-etching process. Accordingly, the thickness of the CVD oxide film 22 on the main surface 13 of the semiconductor silicon substrate 10 is decreased. As a result, the particle 221 may contact with the damage layer 23 on the surface of the CVD oxide film 22 as shown in FIG. 6 and FIG. 24, or the particle 221 may protrude from the CVD oxide film 22.

It should be noted that, in general, it is difficult to form the shield metal layer 26 with a uniform thickness in the through hole 20 through the sputtering process. When the shield metal layer 26 is formed through the sputtering process as performed in the comparative example, an un-sputtered portion 261 or a pin hole may be created in the dimple portion 161 of the aluminum (Al) film 16 as shown in FIG. 27.

In the comparative example, in the next step, when the dry film 28 is formed on the shield metal layer 26, and the opening portion 29 is selectively formed in the dry film 28 as shown in FIG. 19(B), a developing liquid 34 for forming the dry film 28 enters the aluminum (Al) film 16 through the sputtered portion 261 or the pin hole (refer to FIG. 27). As a result, the developing liquid 34 erodes the aluminum (Al) film 16 to create an aluminum (Al) eroded recessed portion 162 as shown in FIG. 29.

In the comparative example, in the next step, as shown in FIG. 20(A), the copper (Cu) plating layer 30 is formed with the dry film 28 as a mask. In this step, the copper (Cu) plating layer 30 is not formed in the Al eroded recessed portion 162, and the Al eroded recessed portion 162 becomes an aluminum (Al) void portion 163.

In the comparative example, in the next step, as shown in FIG. 21, the solder resist 32 is formed on the CVD oxide film 22 on the main surface 13 of the semiconductor silicon substrate 10 and the copper (Cu) plating layer 30 on the main surface 13, and in the opening portion 31 of the copper (Cu) plating layer 30 inside the through hole 20. Afterward, a post process such as forming a solder ball and mounting the semiconductor device 3 is performed. When reflow heat during the step of forming a solder ball, or mounting reflow heat, an external stress, heat shock, and the like during the step of mounting the semiconductor device 3 is applied to the semiconductor device 3, a crack 223 may be generated in the CVD oxide film 22 with the Al void portion 163 as a starting point as shown in FIG. 32. As a result, it is possible to cause a leak malfunction, thereby lowering reliability of the semiconductor device 3.

Further, in the comparative example, after the dry etching process is performed, when the shield metal layer 26 is formed with the sputter method, the shield metal layer 26 is formed on the damage layer 23 created in the dry etching process as shown in FIG. 26. Afterward, after the shield metal layer 26 is immersed in the developing liquid 34 for forming the dry film 28 as shown in FIG. 28, the copper (Cu) plating layer 30 is formed on the shield metal layer 26 as shown in FIG. 30.

During the process described above, in the comparative example, as shown in FIG. 30, the CVD oxide film 22 formed on the main surface 13 of the semiconductor silicon substrate 10 tends to have a portion having a small thickness, or the particle 221 may contact with the copper (Cu) plating layer 30 through the damage layer 23 and the shield metal layer 26 on the CVD oxide film 22. Further, the particle 221 may protrude from the CVD oxide film 22, and contact with the copper (Cu) plating layer 30 through the shield metal layer 26. If these phenomena happen, there may be a leak between the semiconductor silicon substrate 10 and the copper (Cu) plating layer 30 through the particle 221.

Further, in the comparative example, as shown in FIG. 30, the CVD oxide film 22 tends to have a portion having a small thickness at a corner portion 102 of the semiconductor silicon substrate 10 on the side of the through hole 20 during the dry etching. As a result, as shown in FIG. 31, a leak path 222 may be generated at the corner portion 102. If the leak path 222 is generated, there may be a leak between the semiconductor silicon substrate 10 and the copper (Cu) plating layer 30 through the leak path 222 as well.

Further, in the comparative example, the semiconductor device 3 with the silicon through electrode (TSV, Through Silicon Via) includes the CVD oxide film 22 as the insulation film. When a device or a raw material has a temperature limit, it is necessary to form the CVD oxide film 22 at a temperature lower than 200° C. When the CVD oxide film 22 is formed at a temperature lower than 200° C., it is difficult to secure sufficient reliability of the CVD oxide film 22.

On the other hand, in the first embodiment, after the CVD oxide film 22 is etched back through the dry-etching process as shown in FIG. 2(B) (also refer to FIGS. 6 and 7), the organic insulation film 24 is formed on the CVD oxide film 22 inside the through hole 20, the CVD oxide film 22 on the main surface 13, and the aluminum (Al) film 16 exposed at the bottom portion of the through hole 20 as shown in FIG. 3(A) (also refer to FIGS. 8 and 9).

Through the process described above, as shown in FIG. 9, the organic insulation film 24 covers the dimple portion 161 that is created at the lower corner of the bottom portion of the through hole 20 during the dry-etching process as shown in FIG. 6. Accordingly, when the dry film 28 is formed on the shield metal layer 26 formed on the organic insulation film 24 and the opening portion 29 is selectively formed in the dry film 28 as shown in FIG. 4(B), it is possible to prevent the developing liquid 34 for forming the dry film 28 from entering the dimple portion 161 as shown in FIG. 10, thereby preventing the aluminum (Al) film 16 from being corroded.

Further, in the first embodiment, when the CVD oxide film 22 is etched back through the dry-etching process as shown in FIG. 2(B), the CVD oxide film 22 on the main surface 13 of the semiconductor silicon substrate 10 and the CVD oxide film 22 at the corner portion 102 of the semiconductor silicon substrate 10 on the side of the through hole 20 tend to have the small thickness. However, as shown in FIG. 3(A), the organic insulation film 24 covers the CVD oxide film 22 on the main surface 13 of the semiconductor silicon substrate 10 and at the corner portion 102 of the semiconductor silicon substrate 10 as shown in FIG. 8.

As a result, afterward, when the copper (Cu) plating layer 30 is formed on the shield metal layer 26 formed on the organic insulation film 24 as shown in FIG. 5(B), the CVD oxide film 22 is covered with the organic insulation film 24 as shown in FIG. 11. Accordingly, it is possible to prevent the particle 221 from contacting with the copper (Cu) plating layer 30 through the opening portion 23 on the surface of the CVD oxide film 22 or the shield metal layer 26. Further, it is possible to prevent the particle 221 protruding from the CVD oxide film 22 from contacting with the copper (Cu) plating layer 30 through the shield metal layer 26. As a result, it is possible to prevent the leak between the semiconductor silicon substrate 10 and the copper (Cu) plating layer 30 through the particle 221.

Further, in the first embodiment, the CVD oxide film 22 may have the portion having a small thickness at the corner portion 102 of the semiconductor silicon substrate 10 on the side of the through hole 20 during the dry etching. As a result, as shown in FIG. 31, the leak path 222 may be generated at the corner portion 102. However, the CVD oxide film 22 is covered with the organic insulation film 24. Accordingly, it is possible to prevent the leak between the semiconductor silicon substrate 10 and the copper (Cu) plating layer 30 through the leak path 222.

Further, in the first embodiment, when a device or a raw material has a temperature limit, it is necessary to form the CVD oxide film 22 at a temperature lower than 200° C. When the CVD oxide film 22 is formed at a temperature lower than 200° C., it is difficult to secure sufficient reliability of the CVD oxide film 22. However, the CVD oxide film 22 is covered with the organic insulation film 24. Accordingly, it is possible to secure sufficient reliability of the CVD oxide film 22 with the organic insulation film 24.

In the first embodiment, as described above, when the organic insulation film 24 is formed, the semiconductor silicon substrate 10 with the organic insulation film solution coated thereon is placed in the vacuum container, and then, the vacuum container is degassed to be in the vacuum state. Accordingly, an air bubble such as a micro-bubble inside the organic insulation film 24 and an air pocket between the organic insulation film 24 coated in the through hole 20 and the aluminum (Al) film 16 or the CVD oxide film 22 is removed after the organic insulation film solution is coated on the main surface 13. When there is an air bubble inside the organic insulation film 24 or between the organic insulation film 24 and the aluminum (Al) film 16 or the CVD oxide film 22, the air bubble may burst during a thermal treatment performed after the organic insulation film 24 is formed, thereby losing insulation property. However, in the first embodiment, the air bubble is removed under the vacuum state. Accordingly, it is possible to eliminate or minimize the burst of the air bubble during the thermal treatment, thereby preventing insulation property from losing.

Second Embodiment

Figure 16:
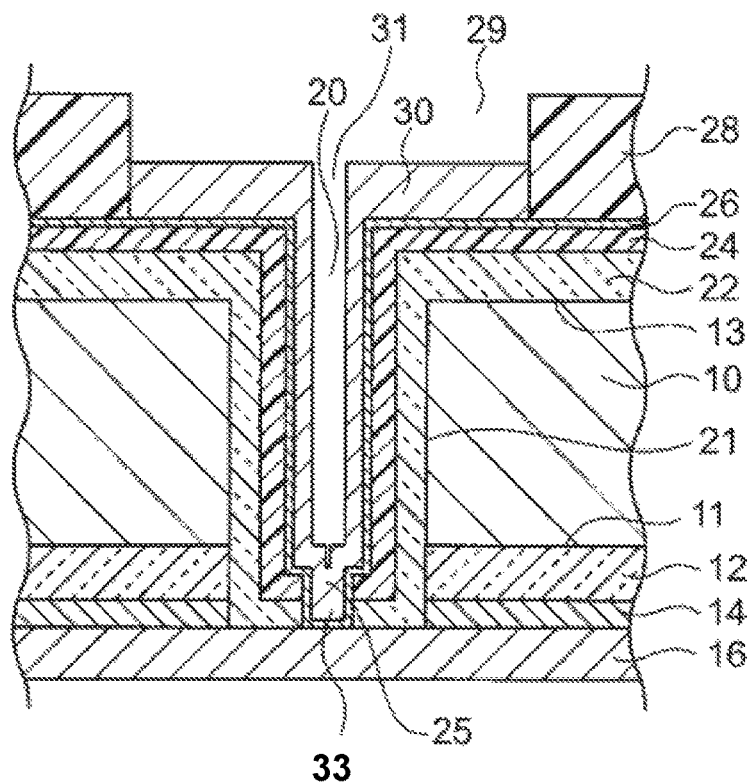
FIGS. 16(A) and 16(B) are schematic vertical sectional views No. 5 showing the method of producing the semiconductor device according to the second embodiment of the present invention.
Figure 16:
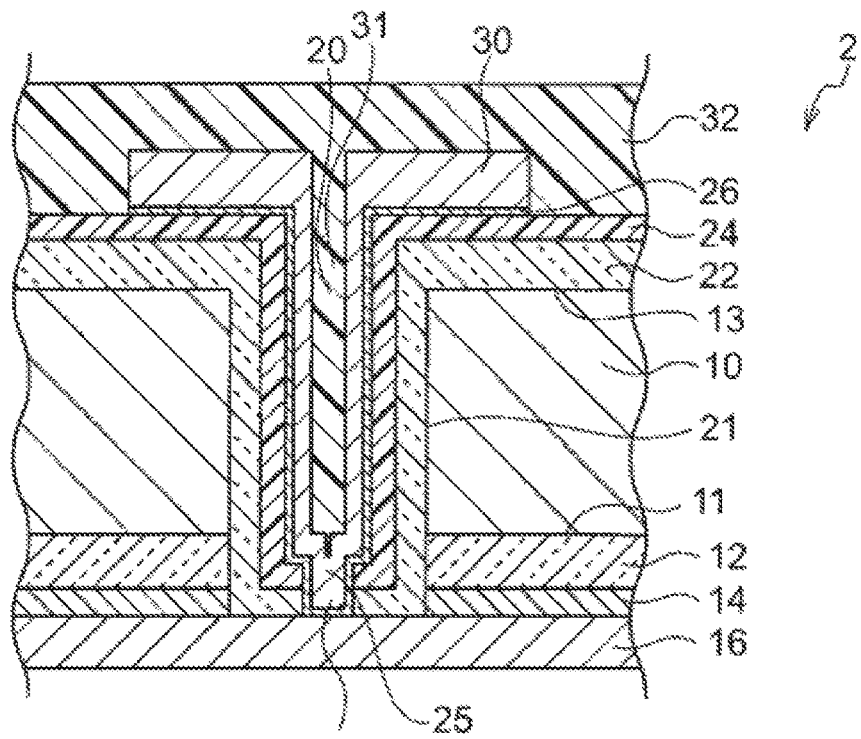

A second embodiment of the present invention will be explained next. As shown in FIG. 16(B), a semiconductor device 2 includes a semiconductor silicon substrate 10; a silicon oxide film 12; a titanium nitride (TiN) film 14; an aluminum (Al) film 16; a through hole 20; a CVD (Chemical Vapor Deposition) oxide film 22; an organic insulation film 24; a shield metal layer 26; a copper (Cu) plating layer 30; and a solder resist 32.

In the second embodiment, the silicon oxide film 12 is disposed on a main surface 11 of the semiconductor silicon substrate 10. The titanium nitride (TiN) film 14 is disposed on the silicon oxide film 12. Further, the aluminum (Al) film 16 is disposed on the titanium nitride (TiN) film 14.

In the second embodiment, the through hole 20 is formed to penetrate through the semiconductor silicon substrate 10 from the main surface 11 to a main surface 13 of the semiconductor silicon substrate 10 opposite to the main surface 11. Further, the through hole 20 penetrates through the silicon oxide film 12 and the titanium nitride (TiN) film 14, so that the aluminum (Al) film 16 is exposed at a bottom portion thereof.

In the second embodiment, the CVD oxide film 22 is disposed on a side surface 21 of the through hole 20 and the main surface 13 of the semiconductor silicon substrate 10. Further, the CVD oxide film 22 is disposed on the aluminum (Al) film 16 exposed at the bottom portion of the through hole 20.

In the second embodiment, the organic insulation film 24 is disposed on the CVD oxide film 22 on the side surface 21 of the through hole 20, the CVD oxide film 22 on the main surface 13, and the CVD oxide film 22 at the bottom portion of the through hole 20.

In the second embodiment, the shield metal layer 26 is disposed on the organic insulation film 24 on the side surface 21 of the through hole 20, the organic insulation film 24 at the bottom portion of the through hole 20, the organic insulation film 24 on the main surface 13, an opening portion 25 of the organic insulation film 24 at the bottom portion of the through hole 20, and the aluminum (Al) film 16 exposed in the opening portion 23 of the CVD oxide film 22.

In the second embodiment, the copper (Cu) plating layer 30 is disposed on the shield metal layer 26 on the organic insulation film 24 of the side surface 21 of the through hole 20, the shield metal layer 26 on the organic insulation film 24 at the bottom portion of the through hole 20, the shield metal layer 26 on the organic insulation film 24 on the main surface 13, the opening portion 25 of the organic insulation film 24 at the bottom portion of the through hole 20, and the shield metal layer 26 disposed on the opening portion 23 of the CVD oxide film 22. It should be noted that the copper (Cu) plating layer 30 and the shield metal layer 26 constitute a silicon through electrode. It should be also noted that the copper (Cu) plating layer 30 on the main surface 13 has a film thickness greater than a film thickness of the copper (Cu) plating layer 30 on the side surface 21 or at the bottom portion of the through hole 20.

In the second embodiment, the solder resist 32 is disposed on the organic insulation film 24 on the main surface 13 of the semiconductor silicon substrate 10, the copper (Cu) plating layer 30 on the main surface 13, and in an opening portion 31 of the copper (Cu) plating layer 30 inside the through hole 20.

In the second embodiment, a circuit element (not shown) including a semiconductor element such as a MOS (Metal Oxide Semiconductor) transistor is formed on the main surface 11 of the semiconductor silicon substrate 10, and is covered with the silicon oxide film 12. The aluminum (Al) film 16 is provided as a device pad and the like for connecting the semiconductor device 2.

A method of producing the semiconductor device 2 will be explained next with reference to FIGS. 12(A)-12(C) to FIG. 16(A)-16(B).

Figure 14:
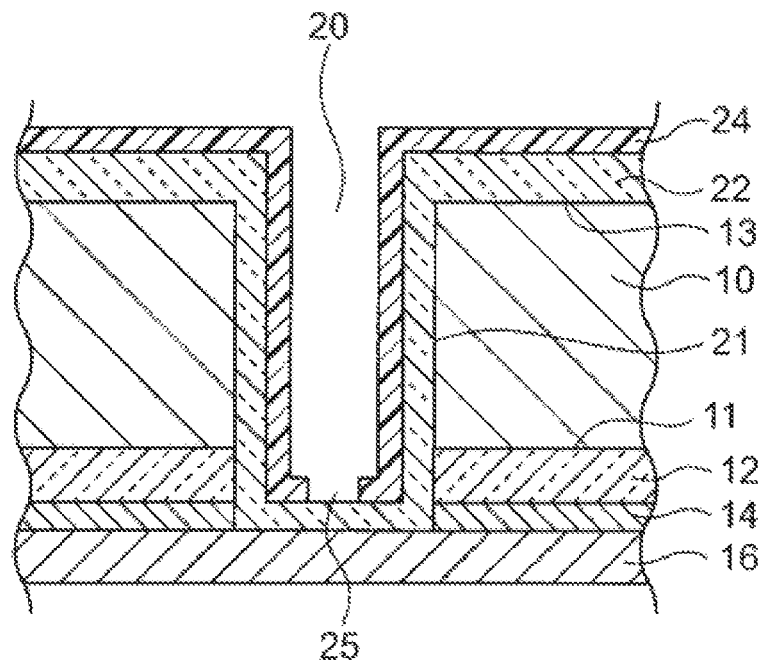
FIGS. 14(A) and 14(B) are schematic vertical sectional views No. 3 showing the method of producing the semiconductor device according to the second embodiment of the present invention.
Figure 14:
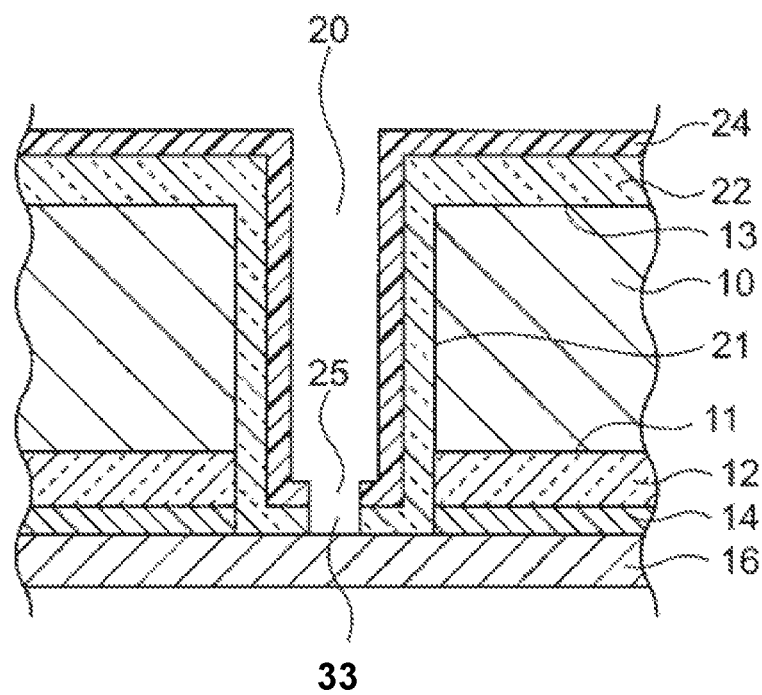
Figure 15:
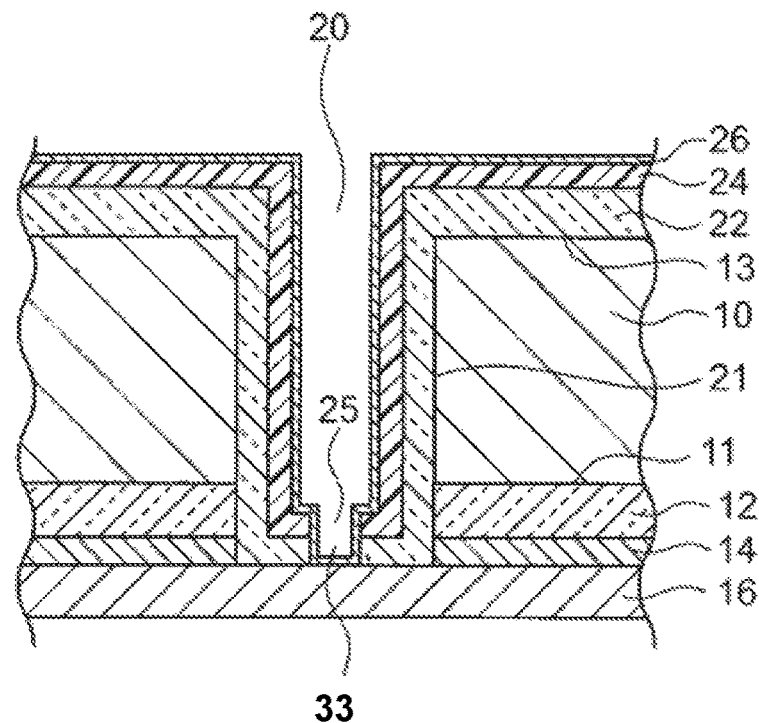
FIGS. 15(A) and 15(B) are schematic vertical sectional views No. 4 showing the method of producing the semiconductor device according to the second embodiment of the present invention.
Figure 15:
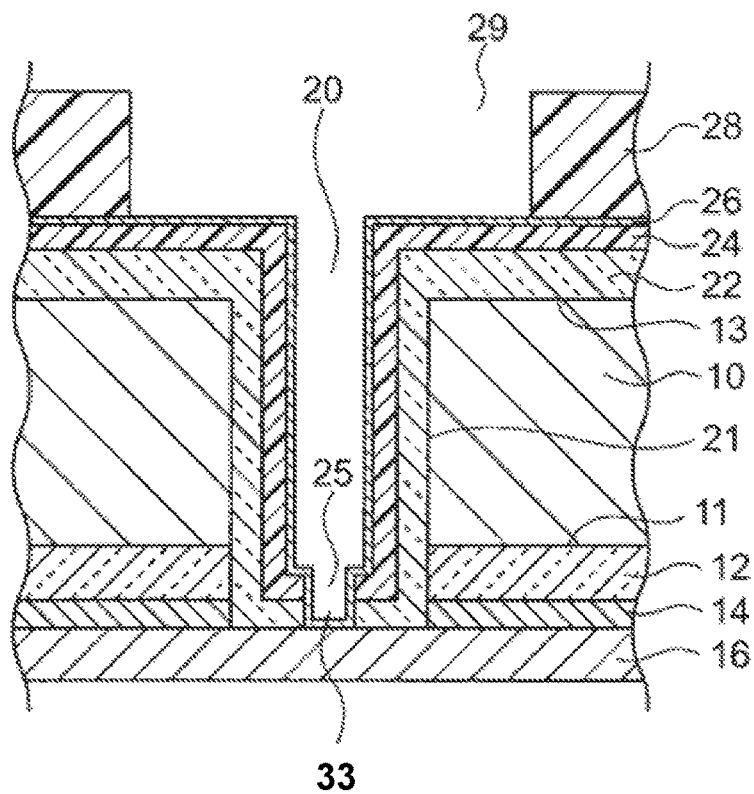

FIGS. 12(A) to 12(C) are schematic vertical sectional views No. 1 showing the method of producing the semiconductor device 2 according to the second embodiment of the present invention. FIGS. 13(A) and 13(B) are schematic vertical sectional views No. 2 showing the method of producing the semiconductor device 2 according to the second embodiment of the present invention. FIGS. 14(A) and 14(B) are schematic vertical sectional views No. 3 showing the method of producing the semiconductor device 2 according to the second embodiment of the present invention. FIGS. 15(A) and 15(B) are schematic vertical sectional views No. 4 showing the method of producing the semiconductor device 2 according to the second embodiment of the present invention. FIGS. 16(A) and 16(B) are schematic vertical sectional views No. 5 showing the method of producing the semiconductor device 2 according to the second embodiment of the present invention.

In the second embodiment, first, the circuit element (not shown) including the semiconductor element such as the MOS (Metal Oxide Semiconductor) transistor is formed on the main surface 11 of the semiconductor silicon substrate 10.

In the next step, as shown in FIG. 12(A), the silicon oxide film 12 is formed on the main surface 11 of the semiconductor silicon substrate 10, and the titanium nitride (TiN) film 14 is formed on the silicon oxide film 12. Further, the aluminum (Al) film 16 is formed on the titanium nitride (TiN) film 14. It should be noted that the titanium nitride (TiN) film 14 is provided for preventing aluminum from migrating.

In the next step, as shown in FIG. 12(B), the resist layer 18 is formed on the main surface 13 of the semiconductor silicon substrate 10 opposite to the main surface 11, and the opening portion 19 is selectively formed in the resist layer 18. Afterward, the semiconductor silicon substrate 10 is etched with the resist layer 18 as a mask, so that the through hole 20 is formed to penetrate through the semiconductor silicon substrate 10 from the main surface 13 to the main surface 11 of the semiconductor silicon substrate 10.

In the next step, as shown in FIG. 12(C), further, the silicon oxide film 12 and the titanium nitride (TiN) film 14 are etched, so that the aluminum (Al) film 16 is exposed at the bottom portion of the through hole 20.

In the next step, as shown in FIG. 13(A), the CVD oxide film 22 is formed on the side surface 21 and the bottom portion of the through hole 20 and the main surface 13 of the semiconductor silicon substrate 10.

In the next step, as shown in FIG. 13(B), the organic insulation film 24 is formed on the CVD oxide film 22 on the side surface 21 of the through hole 20, the CVD oxide film 22 on the main surface 13, and the CVD oxide film 22 at the bottom portion of the through hole 20.

More specifically, when the organic insulation film 24 is formed, first, the semiconductor silicon substrate 10 is placed such that the main surface 11 of the semiconductor silicon substrate 10 faces downwardly, and an organic insulation film solution is coated on the main surface 13. Through this process, the organic insulation film 24 is formed on the CVD oxide film 22 inside the through hole 20, the CVD oxide film 22 on the main surface 13, and the CVD oxide film 22 at the bottom portion of the through hole 20. The organic insulation film solution is coated on the main surface 13 through a spin coating process and the like. Afterward, the semiconductor silicon substrate 10 with the organic insulation film solution coated thereon is placed in a vacuum container. Then, the vacuum container is degassed to be in a vacuum state so as to remove an air bubble such as a micro-bubble inside the organic insulation film 24 or an air bubble such as an air pocket between the organic insulation film 24 coated in the through hole 20 and the CVD oxide film 22.

In the second embodiment, it may be possible to remove an air bubble in the organic insulation film solution before the organic insulation film solution is coated on the main surface 13, so that the organic insulation film 24 does not contain an air bubble such as a micro-bubble therein. However, when the organic insulation film solution is coated on the main surface 13, an air bubble such as an air pocket may be created between the organic insulation film 24 and the CVD oxide film 22. Accordingly, an air bubble such as an air pocket between the organic insulation film 24 and the CVD oxide film 22 is removed after the organic insulation film solution is coated on the main surface 13.

In the second embodiment, the organic insulation film solution with photosensitivity is coated on the main surface 13 to form the organic insulation film 24. After the air bubble is removed in the vacuum state, the organic insulation film 24 is pre-baked.

In the next step, as shown in FIG. 14(A), the opening portion 25 is formed in the organic insulation film 24 at the bottom portion of the through hole 20, so that the CVD oxide film 22 is exposed. More specifically, the organic insulation film 24 is formed from the organic insulation film solution with photosensitivity as described above. Accordingly, the organic insulation film 24 is selectively exposed with light using a photo mask. Afterward, the organic insulation film 24 is developed to form the opening portion 25.

In the next step, as shown in FIG. 14(B), an opening portion 33 is formed in the CVD oxide film 22 just beneath the opening portion 25 of the organic insulation film 24 with the organic insulation film 24 having the opening portion 25 formed therein.

In the next step, as shown in FIG. 15(A), the shield metal layer 26 is formed with a sputter method. More specifically, the shield metal layer 26 is formed on the organic insulation film 24 on the side surface 21 of the through hole 20; the organic insulation film 24 at the bottom portion of the through hole 20; the organic insulation film 24 on the main surface 13; a sidewall of the opening portion 25 formed in the organic insulation film 24 at the bottom portion of the through hole 20; a sidewall of the opening portion 33 of the CVD oxide film 22; and the aluminum (Al) film 16 exposed in the opening portion 25 of the organic insulation film 24 and the opening portion 33 of the CVD oxide film 22. In this step, titanium (Ti) is sputtered first, and then copper (Cu) is sputtered, so that the shield metal layer 26 is formed.

In the next step, as shown in FIG. 15(B), the dry film 28 is formed, and the opening portion 29 is selectively formed in the dry film 28. Accordingly, the through hole 20 is exposed in the opening portion 29, and the shield metal layer 26 around the through hole 20 is exposed.

In the next step, as shown in FIG. 16(A), the copper (Cu) plating layer 30 is formed with the dry film 28 as a mask. More specifically, the copper (Cu) plating layer 30 is formed on the shield metal layer 26 on the side surface 21 of the through hole 20; the shield metal layer 26 in the opening portion 29 of the dry film 28 on the main surface 13; the sidewall of the opening portion 25 of the organic insulation film 24 at the bottom portion of the through hole 20; a sidewall of the opening portion 33 of the CVD oxide film 22; and the shield metal layer 26 on the aluminum (Al) film 16 exposed in the opening portion 25 of the organic insulation film 24 and the opening portion 33 of the CVD oxide film 22.

In this step, the copper (Cu) plating layer 30 is formed through electrolytic plating using the shield metal layer 26. In the electrolytic plating, an electric current flows through on the main surface 13 more easily than inside the through hole 20. Accordingly, the copper (Cu) plating layer 30 on the main surface 13 has a film thickness greater than that of the copper (Cu) plating layer 30 on the side surface 21 or at the bottom portion of the through hole 20.

In the next step, as shown in FIG. 16(B), the dry film 28 is removed, and then a portion of the shield metal layer 26 not covered with the copper (Cu) plating layer 30 is removed. Afterward, the solder resist 32 is formed on the organic insulation film 24 on the main surface 13 of the semiconductor silicon substrate 10 and the copper (Cu) plating layer 30 on the main surface 13, and in the opening portion 31 of the copper (Cu) plating layer 30 inside the through hole 20.

As described above, in the second embodiment, after the CVD oxide film 22 is formed on the side surface 21 and the bottom portion of the through hole 20 and the main surface 13 of the semiconductor silicon substrate 10 as shown in FIG. 13(A), the organic insulation film 24 is formed on the CVD oxide film 22 on the side surface 21 of the through hole 20, the CVD oxide film 22 on the main surface 13, and the CVD oxide film 22 at the bottom portion of the through hole 20 as shown in FIG. 13(B). Afterward, the opening portion 25 is formed in the organic insulation film 24 at the bottom portion of the through hole 20 as shown in FIG. 14(A), so that the CVD oxide film 22 is exposed. In the next step, as shown in FIG. 14(B), an opening portion 33 is formed in the CVD oxide film 22 just beneath the opening portion 25 of the organic insulation film 24 with the organic insulation film 24 having the opening portion 25 formed therein.

In the second embodiment, through the process described above, the semiconductor device 2 includes the two-layered structure formed of the CVD oxide film 22 and the organic insulation film 24. Accordingly, it is possible to reduce the thickness of the CVD oxide film 22. The material of the CVD oxide film 22 tends to be expensive, so that it is possible to reduce a cost of the semiconductor device 2. Further, when the thickness of the CVD oxide film 22 is reduced, it is possible to improve the efficiency of the CVD film production machine for forming the CVD oxide film 22.

As described above, in the first embodiment, the CVD oxide film 22 is etched back through the dry etching process, so that the aluminum (Al) film 16 is exposed. On the other hand, in the second embodiment, the dry etching process is not performed. Accordingly, when the CVD oxide film 22 is formed, it is possible to prevent damage due to the dry etching process. As a result, it is possible to form the CVD oxide film 22 as the insulation film with high reliability. Further, when the CVD oxide film 22 is formed, the dry etching process is not performed. Accordingly, it is possible to prevent the dimple portion 161 from being created in the aluminum (Al) film 16 at the corner of the bottom portion of the through hole 20 in the first embodiment as shown in FIG. 7.

Further, in the second embodiment, the CVD oxide film 22 is covered with the organic insulation film 24. Accordingly, it is possible to prevent the particle 221 from contacting with the copper (Cu) plating layer 30 through the shield metal layer 26 on the surface of the CVD oxide film 22. Further, it is possible to prevent the particle 221 protruding from the CVD oxide film 22 from contacting with the copper (Cu) plating layer 30 through the shield metal layer 26. As a result, it is possible to prevent the leak between the semiconductor silicon substrate 10 and the copper (Cu) plating layer 30 through the particle 221.

Further, as described above, when the CVD oxide film 22 is formed at a temperature lower than 200° C., it is difficult to secure sufficient reliability of the CVD oxide film 22. However, in the second embodiment, the CVD oxide film 22 is covered with the organic insulation film 24. Accordingly, it is possible to secure sufficient reliability of the CVD oxide film 22 with the organic insulation film 24.

In the second embodiment, as described above, when the organic insulation film 24 is formed, the semiconductor silicon substrate 10 with the organic insulation film solution coated thereon is placed in the vacuum container, and then, the vacuum container is degassed to be in the vacuum state.

Accordingly, an air bubble such as a micro-bubble inside the organic insulation film 24 and an air pocket between the organic insulation film 24 coated in the through hole 20 and the aluminum (Al) film 16 or the CVD oxide film 22 is removed after the organic insulation film solution is coated on the main surface 13. When there is an air bubble inside the organic insulation film 24 or between the organic insulation film 24 and the aluminum (Al) film 16 or the CVD oxide film 22, the air bubble may burst during a thermal treatment performed after the organic insulation film 24 is formed, thereby losing insulation property. However, in the second embodiment, the air bubble is removed under the vacuum state. Accordingly, it is possible to eliminate or minimize the burst of the air bubble during the thermal treatment, thereby preventing insulation property from losing.

In the first and second embodiments, an air bubble such as a micro-bubble inside the organic insulation film 24 and an air pocket between the organic insulation film 24 coated in the through hole 20 and the aluminum (Al) film 16 or the CVD oxide film 22 is removed under the vacuum state. It should be noted that it may be configured such that a vibration is applied to the semiconductor silicon substrate 10 with the organic insulation film solution coated thereon using ultrasonic waves in addition to placing under the vacuum state. Accordingly, it is possible to remove the air bubble more efficiently as compared with removing the air bubble only under the vacuum state.

The disclosure of Japanese Patent Application No. 2013-225826, filed on Oct. 30, 2013, is incorporated in the application by reference.

While the invention has been explained with reference to the specific embodiments of the invention, the explanation is illustrative and the invention is limited only by the appended claims.

What is claimed is:

1. A semiconductor device comprising:
   a semiconductor substrate having a first main surface and a second main surface opposite to the first main surface;
   a first conductive layer disposed above the second main surface;
   a second conductive layer passing through the semiconductor substrate from the first main surface to the second main surface, said second conductive layer being connected to the first conductive layer;
   an organic insulation film disposed to contact with the first conductive layer; and
   a first insulation layer disposed to contact with the organic insulation film,
   wherein said second conductive layer is entirely formed in a two-layered structure,
   said second conductive layer includes a first portion passing through the semiconductor substrate,
   said first portion contacts with the semiconductor substrate through the organic insulation film and the first insulation layer,
   said second conductive layer includes a second portion contacting with the first main surface through the organic insulation film and the first insulation layer, and
   said second portion has a layer thickness greater than that of the first portion.

2. The semiconductor device according to claim 1, wherein said organic insulation film is disposed to cover a surface of the first conductive layer above the second main surface side,
   said organic insulation film includes an opening portion exposing the surface of the first conductive layer above the second main surface side, and
   said second conductive layer is connected to the first conductive layer through the opening portion.

3. The semiconductor device according to claim 1, further comprising a second insulation layer disposed to cover the second main surface,
   wherein said first conductive layer is disposed on the second insulation layer.

4. The semiconductor device according to claim 1, wherein said first conductive layer includes a third conductive layer disposed on the second main surface and a fourth conductive layer disposed on the third conductive layer, and
   said second conductive layer is connected to the fourth conductive layer.

5. The semiconductor device according to claim 1, wherein said second conductive layer is formed of a metal plating layer and a seed metal layer, and
   said seed metal layer is disposed to contact with the organic insulation film.

6. The semiconductor device according to claim 1, wherein said first portion vertically passes through the semiconductor substrate, and
   said second portion extends horizontally over the first main surface perpendicular to the first portion.

7. The semiconductor device according to claim 5, wherein said seed metal layer has a uniform thickness throughout the second conductive layer.

* * * * *